United States Patent
Kong et al.

(10) Patent No.: US 12,426,361 B2
(45) Date of Patent: Sep. 23, 2025

(54) SEMICONDUCTOR DEVICES AND METHODS OF MANUFACTURING THE SAME

(71) Applicant: Samsung Electronics Co., Ltd., Suwon-si (KR)

(72) Inventors: Jeongsoon Kong, Suwon-si (KR); Myung Gil Kang, Suwon-si (KR); Sanghoon Baek, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 487 days.

(21) Appl. No.: 18/059,639

(22) Filed: Nov. 29, 2022

(65) Prior Publication Data

US 2023/0290783 A1 Sep. 14, 2023

(30) Foreign Application Priority Data

Mar. 11, 2022 (KR) .................. 10-2022-0030806
Jun. 28, 2022 (KR) .................. 10-2022-0079221

(51) Int. Cl.
*H10D 84/90* (2025.01)

(52) U.S. Cl.
CPC ......... *H10D 84/907* (2025.01); *H10D 84/931* (2025.01); *H10D 84/953* (2025.01); *H10D 84/981* (2025.01)

(58) Field of Classification Search
CPC ............. H10D 30/6757; H10D 84/907; H10D 84/931; H10D 84/953; H10D 30/6735
See application file for complete search history.

(56) References Cited

U.S. PATENT DOCUMENTS

| | | | |
|---|---|---|---|
| 10,249,709 B2 | 4/2019 | Cheng et al. | |
| 11,031,395 B2 | 6/2021 | Ohtou et al. | |
| 11,151,297 B2 | 10/2021 | Lai et al. | |
| 11,152,348 B2 | 10/2021 | Sio et al. | |
| 2018/0219064 A1 | 8/2018 | Cheng et al. | |
| 2020/0045193 A1 | 2/2020 | Mori | |
| 2020/0091349 A1* | 3/2020 | Kang | H10D 84/856 |
| 2020/0105761 A1* | 4/2020 | Liaw | H10D 84/853 |
| 2020/0168715 A1 | 5/2020 | Wu et al. | |
| 2020/0357786 A1 | 11/2020 | Sio et al. | |
| 2021/0233909 A1 | 7/2021 | Bao et al. | |
| 2021/0271797 A1 | 9/2021 | Lai et al. | |
| 2021/0336001 A1 | 10/2021 | Yang et al. | |

* cited by examiner

*Primary Examiner* — Changhyun Yi
(74) *Attorney, Agent, or Firm* — Wolf, Greenfield & Sacks, P.C.

(57) ABSTRACT

A semiconductor device includes a substrate including an N-stack cell, a buffer cell and an M-stack cell that are on the substrate, the buffer cell being between the N-stack and M-stack cells, an active pattern extending from the N-stack cell to the M-stack cell via the buffer cell, an N-stack channel pattern on the active pattern of the N-stack cell, an M-stack channel pattern on the active pattern of the M-stack cell, a dummy channel pattern on the active pattern of the buffer cell, an N-stack epitaxial pattern between the N-stack channel pattern and the dummy channel pattern, and an M-stack epitaxial pattern between the M-stack channel pattern and the dummy channel pattern. The N-stack channel pattern includes stacked N semiconductor patterns. The M-stack channel pattern includes stacked M semiconductor patterns. Each of N and M is an integer number of 2 or more, and M is greater than N.

20 Claims, 32 Drawing Sheets

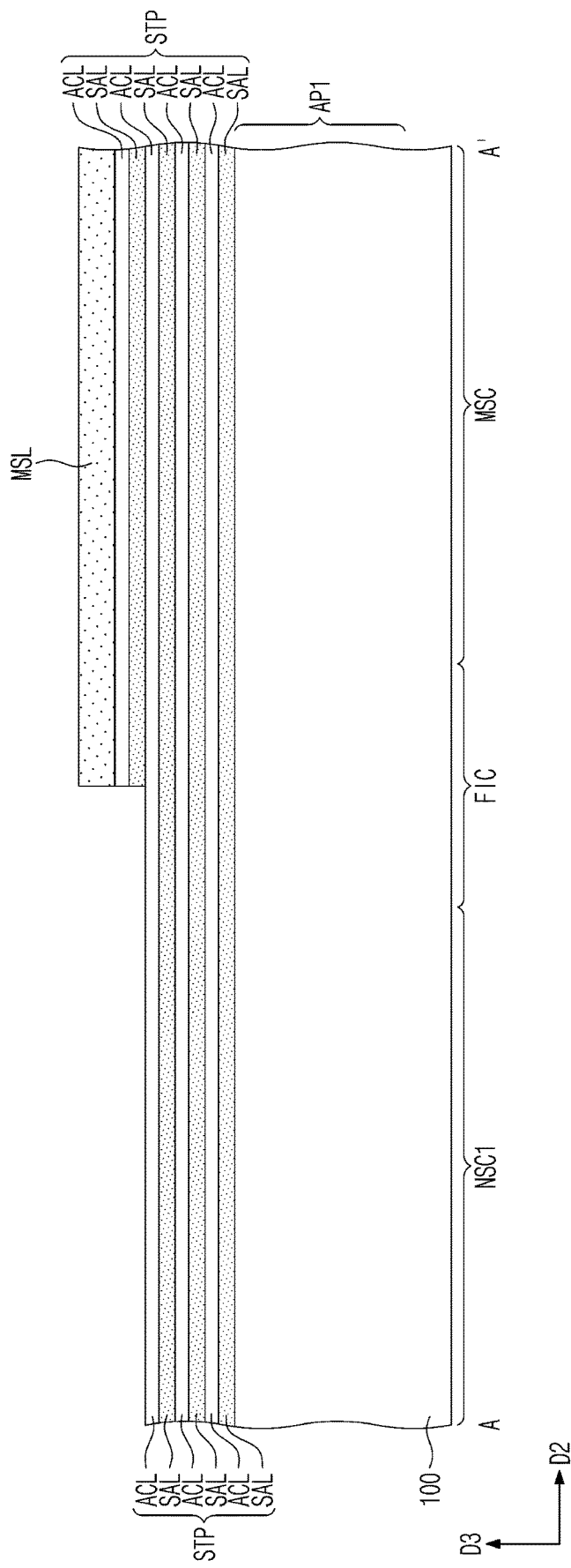

SEMICONDUCTOR DEVICES AND METHODS OF MANUFACTURING THE SAME

CROSS-REFERENCE TO RELATED APPLICATIONS

This U.S. non-provisional patent application claims priority under 35 U.S.C. § 119 to Korean Patent Application Nos. 10-2022-0030806 and 10-2022-0079221, filed on Mar. 11, 2022 and Jun. 28, 2022, respectively, in the Korean Intellectual Property Office, the entire contents of each of which are hereby incorporated by reference.

BACKGROUND

The present disclosure relates to semiconductor devices and methods of manufacturing the same. Semiconductor devices may include integrated circuits including metal-oxide-semiconductor field-effect transistors (MOSFETs). As sizes and design rules of semiconductor devices have been reduced, MOSFETs have been scaled down. Operating characteristics of semiconductor devices may be deteriorated by reduction in size of MOSFETs. Accordingly, various methods for forming semiconductor devices which have excellent performance while overcoming limitations caused by high integration have been studied.

SUMMARY

Embodiments of the inventive concepts may provide a low-power semiconductor device with improved electrical characteristics.

Embodiments of the inventive concepts may also provide a method of manufacturing a low-power semiconductor device with improved electrical characteristics.

In an aspect, a semiconductor device may include a substrate including an N-stack cell region, a buffer cell region, and an M-stack cell region, where the buffer cell region is between the N-stack cell region and the M-stack cell region; an active pattern extending from an N-stack cell that is on the N-stack cell region to an M-stack cell that is on the M-stack cell region via a buffer cell that is on the buffer cell region; an N-stack channel pattern on a first portion of the active pattern in the N-stack cell; an M-stack channel pattern on a second portion of the active pattern in the M-stack cell; a dummy channel pattern on a third portion of the active pattern in the buffer cell; an N-stack epitaxial pattern between the N-stack channel pattern and the dummy channel pattern; and an M-stack epitaxial pattern between the M-stack channel pattern and the dummy channel pattern. The N-stack channel pattern may include N semiconductor patterns that are stacked. The M-stack channel pattern may include M semiconductor patterns that are stacked. Each of N and M may be an integer number of 2 or more, and M may be greater than N. A bottom surface of the N-stack epitaxial pattern may be lower than a bottom surface of the M-stack epitaxial pattern.

In an aspect, a semiconductor device may include a first power interconnection line and a second power interconnection line on a substrate; and an N-stack cell, a buffer cell, and an M-stack cell that are in a cell block between the first and second power interconnection lines. The N-stack cell may include a first gate-all-around field-effect transistor (GAAFET) comprising N nanosheets, and the M-stack cell may include a second GAAFET comprising M nanosheets. Each of N and M may be an integer number of 2 or more, and M may be greater than N. The buffer cell may be between the N-stack cell and the M-stack cell. The N nanosheets transition to the M nanosheets in the buffer cell.

In an aspect, a semiconductor device may include a substrate comprising a first active pattern and a second active pattern that are spaced apart from each other in a first direction; a device isolation layer in a trench between the first and second active patterns; an N-stack channel pattern on the first active pattern, the N-stack channel pattern comprising N semiconductor patterns that are spaced apart from each other and are vertically stacked; an M-stack channel pattern on the second active pattern, the M-stack channel pattern comprising M semiconductor patterns that are spaced apart from each other and are vertically stacked; an N-stack gate electrode on the N-stack channel pattern, the N-stack gate electrode surrounding a top surface, a bottom surface, and opposite sidewalls of each of the N semiconductor patterns; an M-stack gate electrode on the M-stack channel pattern, the M-stack gate electrode surrounding a top surface, a bottom surface, and opposite sidewalls of each of the M semiconductor patterns; and a gate cutting pattern between the N-stack gate electrode and the M-stack gate electrode. Each of N and M may be an integer number of 2 or more, and M may be greater than N. The gate cutting pattern is between, in the first direction, the N-stack gate electrode and the M-stack gate electrode. A width of the N-stack channel pattern in the first direction may be different from a width of the M-stack channel pattern in the first direction.

In an aspect, a method of manufacturing a semiconductor device may include forming a stack pattern on a substrate including an N-stack cell region, a buffer cell region, and an M-stack cell region, the buffer cell region being between the N-stack cell region and the M-stack cell region, and the stack pattern comprising M active layers that are spaced apart from each other and are vertically stacked; forming a mask layer covering a first portion of the stack pattern that is on the M-stack cell region and exposing a second portion of the stack pattern that is on the N-stack cell region, the mask layer covering a third portion of the stack pattern that is on the buffer cell region and exposing a fourth portion of the stack pattern that is on the buffer cell region; removing at least one of the M active layers from the N-stack cell region using the mask layer as an etch mask, such that N active layers remain on the N-stack cell region; forming a plurality of sacrificial patterns on the stack pattern; forming an N-stack epitaxial pattern on the N-stack cell region; forming an M-stack epitaxial pattern on the M-stack cell region; replacing a sacrificial pattern on the N-stack cell region among the plurality of sacrificial patterns with an N-stack gate electrode; replacing a sacrificial pattern on the M-stack cell region among the plurality of sacrificial patterns with an M-stack gate electrode; and replacing a sacrificial pattern on the buffer cell region among the plurality of sacrificial patterns with a dummy gate electrode. Each of N and M may be an integer number of 2 or more, and M may be greater than N.

BRIEF DESCRIPTION OF THE DRAWINGS

FIGS. 7A, 7B, 8A, 8B, 9A, 9B, 10A, 10B, 10C, 11A, 11B, 11C, 12A, 12B, 12C, 13A, 13B, and 13C are cross-sectional views illustrating a method of manufacturing a semiconductor device according to some embodiments of the inventive concepts.

DETAILED DESCRIPTION

Figure 1:
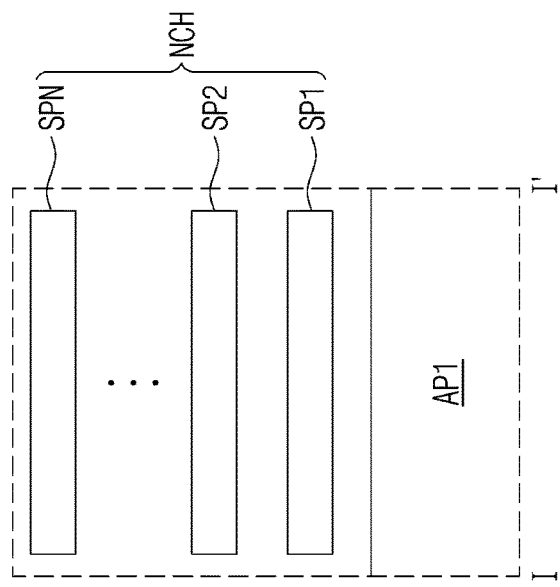
FIGS. 1 and 2 are conceptual/schematic views illustrating logic cells of a semiconductor device according to some embodiments of the inventive concepts.
Figure 1:
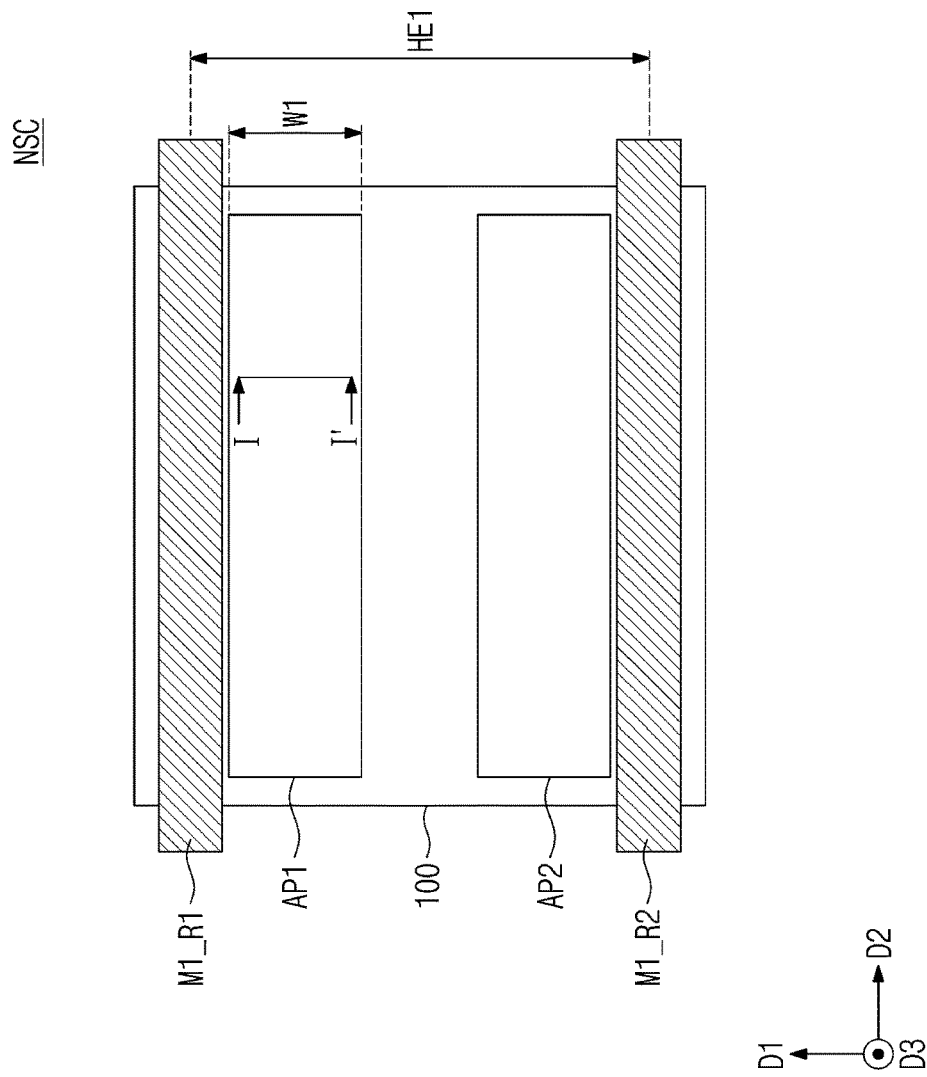
Figure 2:
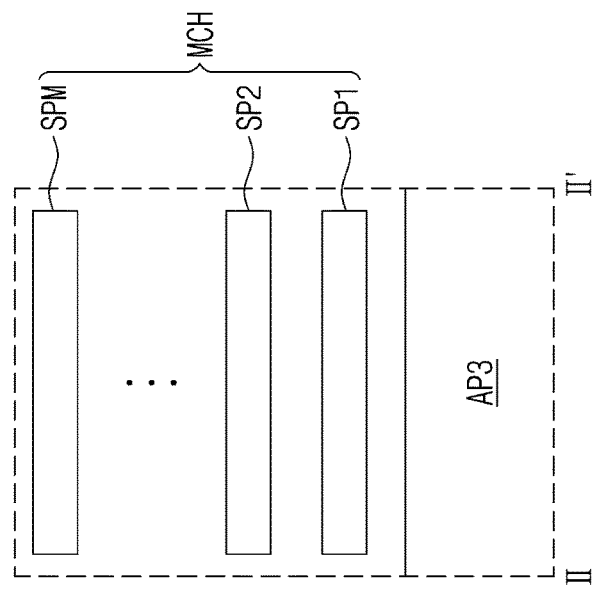
Figure 2:
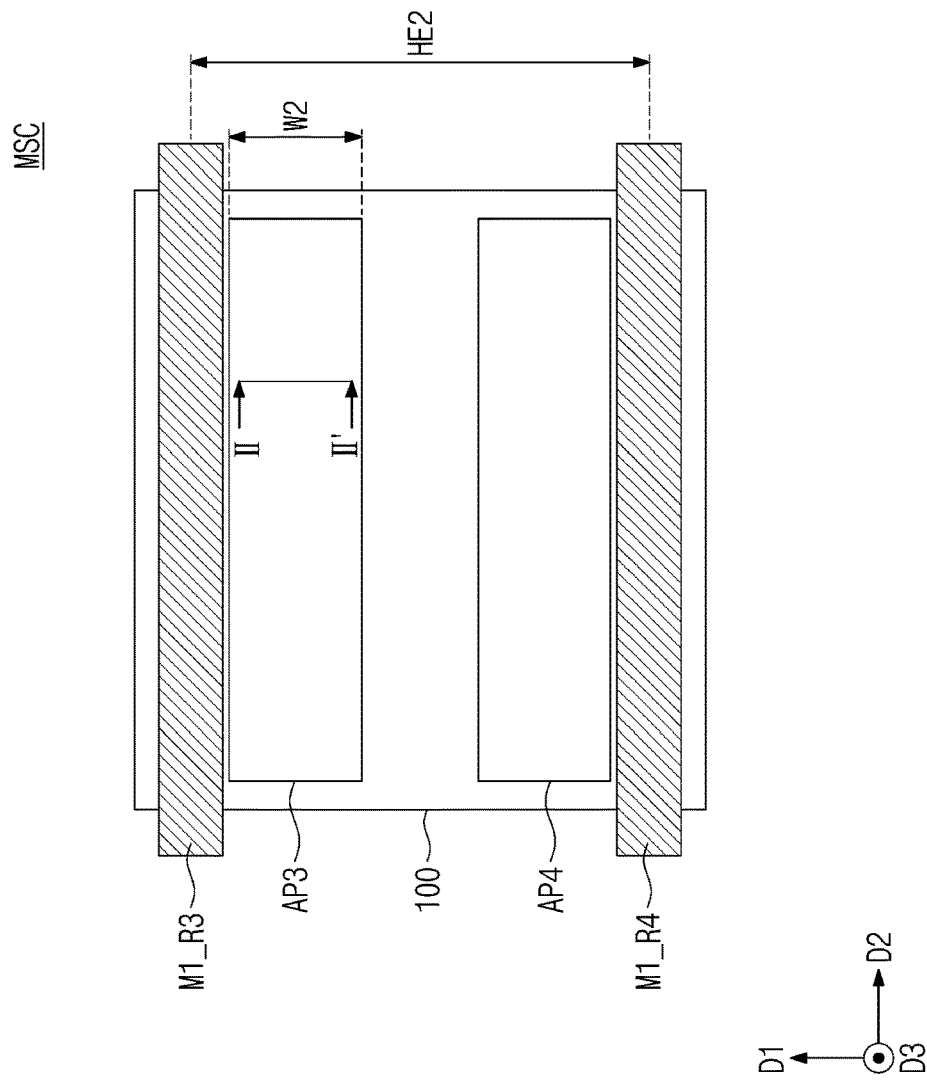

FIGS. 1 and 2 are conceptual views illustrating logic cells of a semiconductor device according to some embodiments of the inventive concepts.

Referring to FIG. 1, an N-stack cell NSC corresponding to a logic cell may be provided. More particularly, a first power interconnection line M1_R1 and a second power interconnection line M1_R2 may be provided on a substrate 100. In some embodiments, the substrate 100 may comprise an N-stack cell region on which layers/elements of the N-stack cell NSC are provided/stacked. The first power interconnection line M1_R1 may be a path through which a source voltage (VSS (FIGS. 6C and 6D), e.g., a ground voltage) is provided. The second power interconnection line M1_R2 may be a path through which a drain voltage (VDD (FIGS. 6C and 6D), e.g., a power voltage) is provided.

The N-stack cell NSC may be defined between the first power interconnection line M1_R1 and the second power interconnection line M1_R2. The N-stack cell NSC may include a first active pattern AP1 and a second active pattern AP2. In some embodiments, the first active pattern AP1 may be an NMOSFET region, and the second active pattern AP2 may be a PMOSFET region. In other words, the N-stack cell NSC may have a CMOS structure provided between the first power interconnection line M1_R1 and the second power interconnection line M1_R2.

Each of the first and second active patterns AP1 and AP2 may have a first width W1 in a first direction D1. A length of the N-stack cell NSC in the first direction D1 may be defined as a first height HE1. The first height HE1 may be substantially equal to a distance (e.g., a pitch) between the first power interconnection line M1_R1 and the second power interconnection line M1_R2.

The N-stack cell NSC may form a single logic cell. In the present specification, the logic cell may mean a logic element (e.g., an AND element, an OR element, an XOR element, an XNOR element, an inverter, etc.) for performing a specific function. In other words, the logic cell may include transistors and interconnection lines connecting the transistors to each other, which constitute the logic element.

In some embodiments, the N-stack cell NSC may include an N-stack channel NCH on the first active pattern AP1 in a cross-sectional view, taken along a line I-I', of the first active pattern AP1. The N-stack channel NCH may include N semiconductor patterns SP1 to SPN, which are stacked. For example, the N semiconductor patterns SP1 to SPN may include a first semiconductor pattern SP1, a second semiconductor pattern SP2, . . . , and an N-th semiconductor pattern SPN. The N semiconductor patterns SP1 to SPN may be spaced apart from each other and may be stacked. The N semiconductor patterns SP1 to SPN may be N nanosheets.

The number 'N' may be an integer number of 2 or more. For example, the number 'N' may be 3. In other words, the N-stack channel NCH may include three nanosheets. The N-stack cell NSC may be used as a channel of a transistor on the first active pattern AP1. The N-stack channel NCH described above may also be equally/analogously provided on the second active pattern AP2.

Referring to FIG. 2, an M-stack cell MSC corresponding to a logic cell may be provided. More particularly, a third power interconnection line M1_R3 and a fourth power interconnection line M1_R4 may be provided on the substrate 100. The third power interconnection line M1_R3 may be a path through which the source voltage (VSS, e.g., the ground voltage) is provided. The fourth power interconnection line M1_R4 may be a path through which the drain voltage (VDD, e.g., the power voltage) is provided. According to some embodiments, the substrate 100 may comprise an M-stack cell region on which layers/elements of the M-stack cell MSC are provided/stacked.

The M-stack cell MSC may be defined between the third power interconnection line M1_R3 and the fourth power interconnection line M1_R4. The M-stack cell MSC may include a third active pattern AP3 and a fourth active pattern AP4. In some embodiments, the third active pattern AP3 may be an NMOSFET region, and the fourth active pattern AP4 may be a PMOSFET region.

Each of the third and fourth active patterns AP3 and AP4 may have a second width W2 in the first direction D1. The second width W2 may be substantially equal to or different from the first width W1 of FIG. 1. A length of the M-stack cell MSC in the first direction D1 may be defined as a second height HE2. The second height HE2 may be substantially equal to a distance (e.g., a pitch) between the third power interconnection line M1_R3 and the fourth power interconnection line M1_R4. The second height HE2 may be substantially equal to or different from the first height HE1 of FIG. 1.

For example, the M-stack cell MSC may include an M-stack channel MCH on the third active pattern AP3 in a cross-sectional view, taken along a line II-II', of the third active pattern AP3. The M-stack channel MCH may include M semiconductor patterns SP1 to SPM, which are stacked. The M semiconductor patterns SP1 to SPM may be M nanosheets.

The number 'M' may be an integer number of 2 or more and may be different from the number 'N'. For example, the number 'M' may be 4. In other words, the M-stack channel MCH may include four nanosheets. The M-stack channel MCH may be used as a channel of a transistor on the third active pattern AP3. The M-stack channel MCH described above may also be equally/analogously provided on the fourth active pattern AP4.

The number M of the nanosheets of the M-stack channel MCH of the M-stack cell MSC may be greater than the number N of the nanosheets of the N-stack channel NCH of the N-stack cell NSC. In this case, an effective channel width of a transistor of the M-stack cell MSC may be greater than an effective channel width of a transistor of the N-stack cell NSC. In other words, even though the first width W1 of each of the first and second active patterns AP1 and AP2 is equal to the second width W2 of each of the third and fourth active patterns AP3 and AP4, a size of the channel of the transistor of the M-stack cell MSC may be greater than a size of the channel of the transistor of the N-stack cell NSC. As a result, the M-stack cell MSC may operate at a higher speed than the N-stack cell NSC.

Meanwhile, an effective capacitance of the transistor of the M-stack cell MSC may be greater than an effective capacitance of the transistor of the N-stack cell NSC. The effective capacitance may be proportional to an overlapping area between a gate and a source/drain, and in other words, the effective capacitance may be proportional to the number of the stacked nanosheets. Thus, power consumption of the M-stack cell MSC may be greater than power consumption of the N-stack cell NSC.

According to some embodiments of the inventive concepts, the M-stack cell MSC may be used as a logic cell having/requiring a high-speed operation and the N-stack cell NSC may be used as a logic cell having/requiring low power consumption, and thus electrical characteristics of the semiconductor device may be improved.

Figure 3:
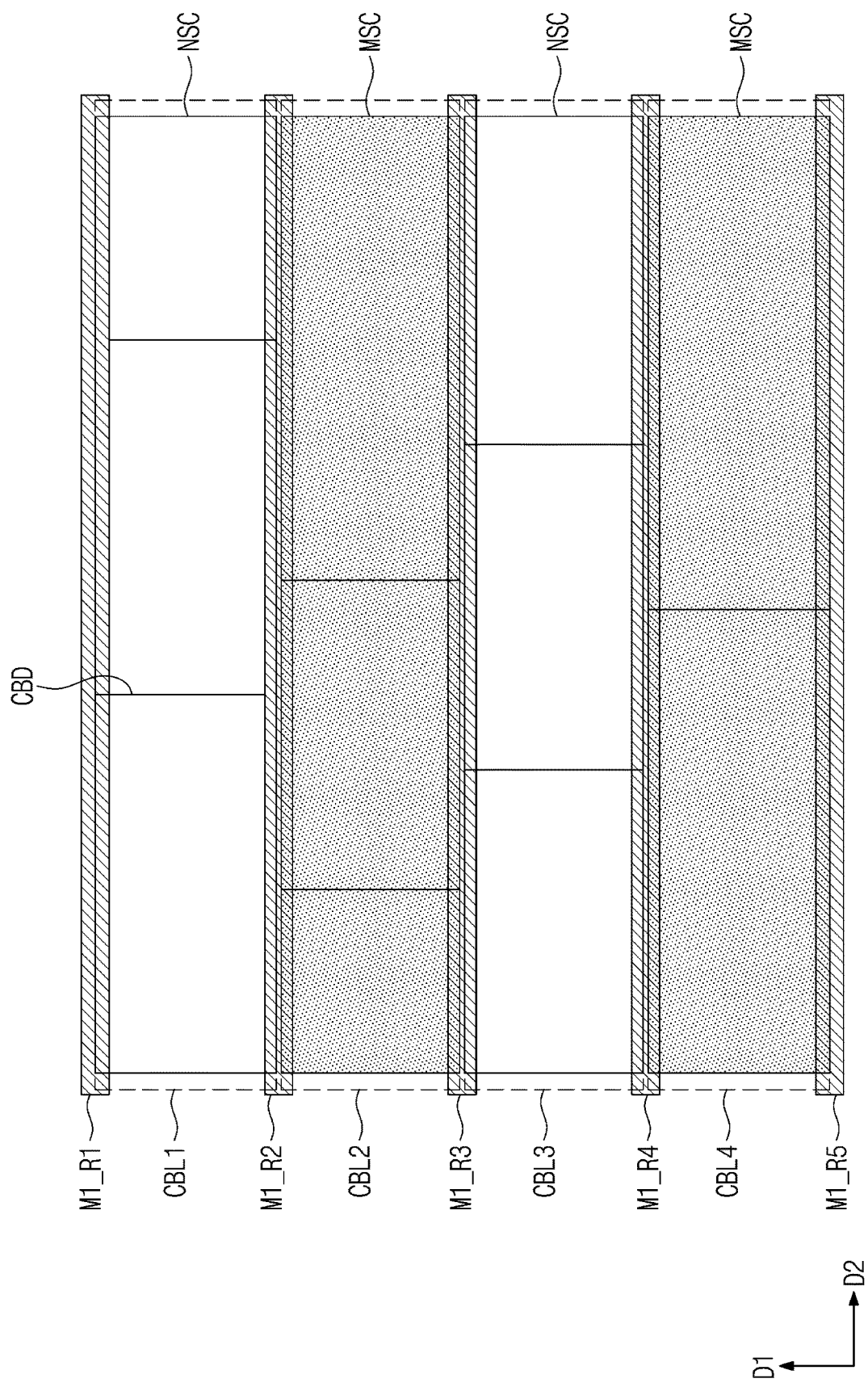
FIG. 3 is a plan view illustrating logic cells two-dimensionally arranged on a substrate, according to some embodiments of the inventive concepts.

FIG. 3 is a plan view illustrating logic cells two-dimensionally arranged on a substrate, according to some embodiments of the inventive concepts.

Referring to FIG. 3, N-stack cells NSC and M-stack cells MSC may be two-dimensionally arranged on a substrate 100 (FIGS. 1 and 2). More particularly, first to fifth power interconnection lines M1_R1 to M1_R5 may be provided on the substrate 100. The first to fifth power interconnection lines M1_R1 to M1_R5 may extend in a second direction D2 in parallel to each other. The first to fifth power interconnection lines M1_R1 to M1_R5 may be arranged (e.g., spaced apart from each other) in the first direction D1.

A first cell block CBL1 may be defined between the first and second power interconnection lines M1_R1 and M1_R2. A second cell block CBL2 may be defined between the second and third power interconnection lines M1_R2 and M1_R3. A third cell block CBL3 may be defined between the third and fourth power interconnection lines M1_R3 and M1_R4. A fourth cell block CBL4 may be defined between the fourth and fifth power interconnection lines M1_R4 and M1_R5.

In some embodiments, the N-stack cells NSC may be arranged (e.g., spaced apart from each other) in the second direction D2 in the first cell block CBL1. The M-stack cells MSC may be arranged (e.g., spaced apart from each other) in the second direction D2 in the second cell block CBL2. The N-stack cells NSC may be arranged in the second direction D2 in the third cell block CBL3. The M-stack cells MSC may be arranged in the second direction D2 in the fourth cell block CBL4. In other words, one kind of the N-stack cells NSC may be disposed in one cell block. Alternatively, one kind of the M-stack cells MSC may be disposed in one cell block.

For example, a cell boundary CBD may be defined between the N-stack cells NSC adjacent to each other in the first cell block CBL1. Since the N-stack cells NSC adjacent to each other include the same number of the stacked nanosheets, they may be directly adjacent to each other with the cell boundary CBD interposed therebetween. For example, the cell boundary CBD may include an isolation structure DB (e.g., a single diffusion break) to be described later (e.g., with respect to FIG. 5).

Figure 4:
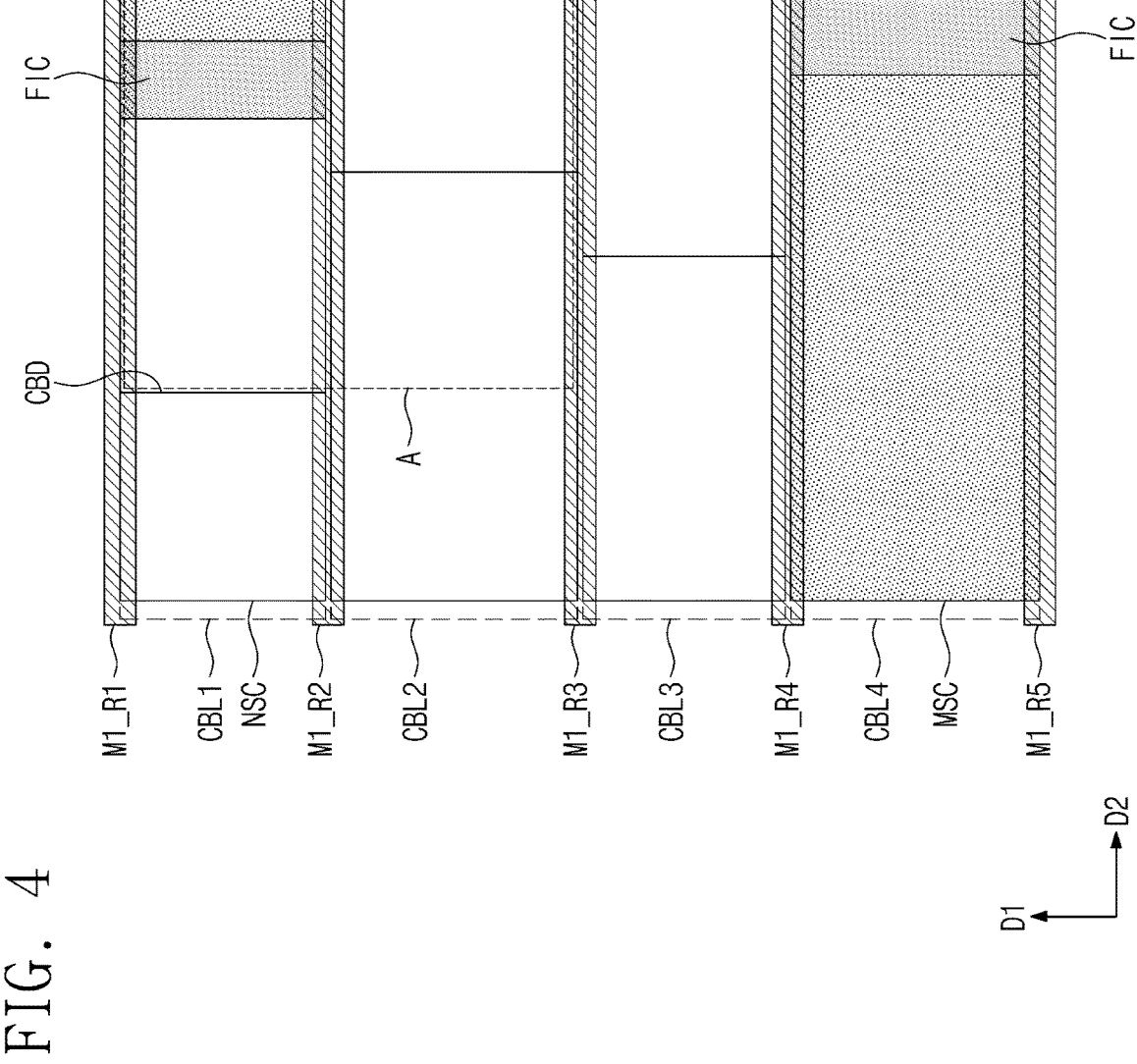
FIG. 4 is a plan view illustrating logic cells two-dimensionally arranged on a substrate, according to some embodiments of the inventive concepts.

FIG. 4 is a plan view illustrating logic cells two-dimensionally arranged on a substrate, according to some embodiments of the inventive concepts.

Referring to FIG. 4, N-stack cells NSC and M-stack cells MSC may be two-dimensionally arranged on a substrate 100. More particularly, first to fifth power interconnection lines M1_R1 to M1_R5 may be provided on the substrate 100. First to fourth cell blocks CBL1 to CBL4 may be defined between the first to fifth power interconnection lines M1_R1 to M1_R5.

In some embodiments, a cell height of the first cell block CBL1 may be different from a cell height of the second cell block CBL2. For example, the cell height of the first cell block CBL1 may be a first height HE1, and the cell height of the second cell block CBL2 may be a second height HE2 greater than the first height HE1. In other words, a cell height of a logic cell disposed in the second cell block CBL2 may be greater than a cell height of a logic cell disposed in the first cell block CBL1.

A cell height of the third cell block CBL3 may be the first height HE1, and a cell height of the fourth cell block CBL4 may be the second height HE2. In other words, a cell height of a logic cell disposed in the fourth cell block CBL4 may be greater than a cell height of a logic cell disposed in the third cell block CBL3.

At least one N-stack cell NSC and at least one M-stack cell MSC may be disposed in the first cell block CBL1. The N-stack cell NSC and the M-stack cell MSC may be adjacent to each other in the second direction D2 in the first cell block CBL1. A buffer cell FIC may be disposed in the first cell block CBL1. The buffer cell FIC may be disposed between the N-stack cell NSC and the M-stack cell MSC, which are adjacent to each other. In other words, a buffer region (e.g., the buffer cell FIC), not the cell boundary CBD, may be used/required between the N-stack cell NSC and the M-stack cell MSC adjacent to each other in the second direction D2.

The buffer cell FIC may be a dummy cell between the N-stack cell NSC and the M-stack cell MSC, which are arranged side by side in one cell block. The buffer cell FIC may not perform any circuit function. The buffer cell FIC may be a region in which the N nanosheets of the N-stack cell NSC transition to the M nanosheets of the M-stack cell MSC. In some embodiments, the substrate 100 may comprise a buffer cell region on which layers/elements of the buffer cell FIC are provided/stacked.

At least one N-stack cell NSC and at least one M-stack cell MSC may also be disposed in the fourth cell block CBL4. The buffer cell FIC may also be disposed between the N-stack cell NSC and the M-stack cell MSC, which are adjacent to each other in the fourth cell block CBL4.

Figure 5:
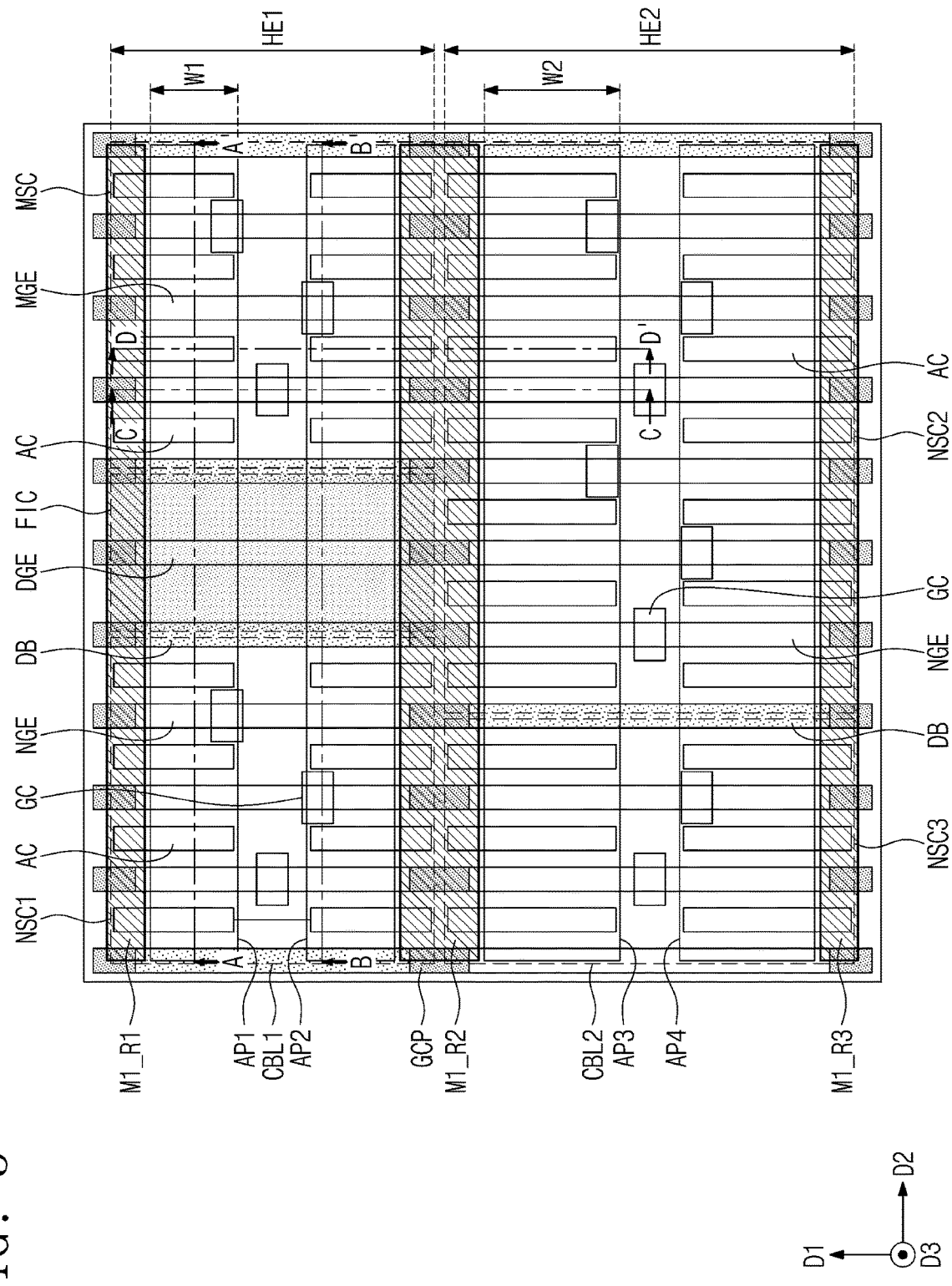
FIG. 5 is a plan view illustrating a semiconductor device according to some embodiments of the inventive concepts.

FIG. 5 is a plan view illustrating a semiconductor device according to some embodiments of the inventive concepts. FIGS. 6A, 6B, 6C and 6D are cross-sectional views taken along lines A-A', B-B', C-C' and D-D' of FIG. 5, respectively. FIGS. 5 and 6A to 6D may correspond to a region 'A' of FIG. 4.

Referring to FIGS. 5 and 6A to 6D, first to third N-stack cells NSC1, NSC2 and NSC3 and an M-stack cell MSC may be provided on a substrate 100. Logic transistors constituting a logic circuit may be disposed on each of the first to third N-stack cells NSC1, NSC2 and NSC3 and the M-stack cell MSC. The substrate 100 may be a semiconductor substrate including silicon, germanium or silicon-germanium, or a compound semiconductor substrate. For example, the substrate 100 may be a silicon substrate.

Figure 6A:
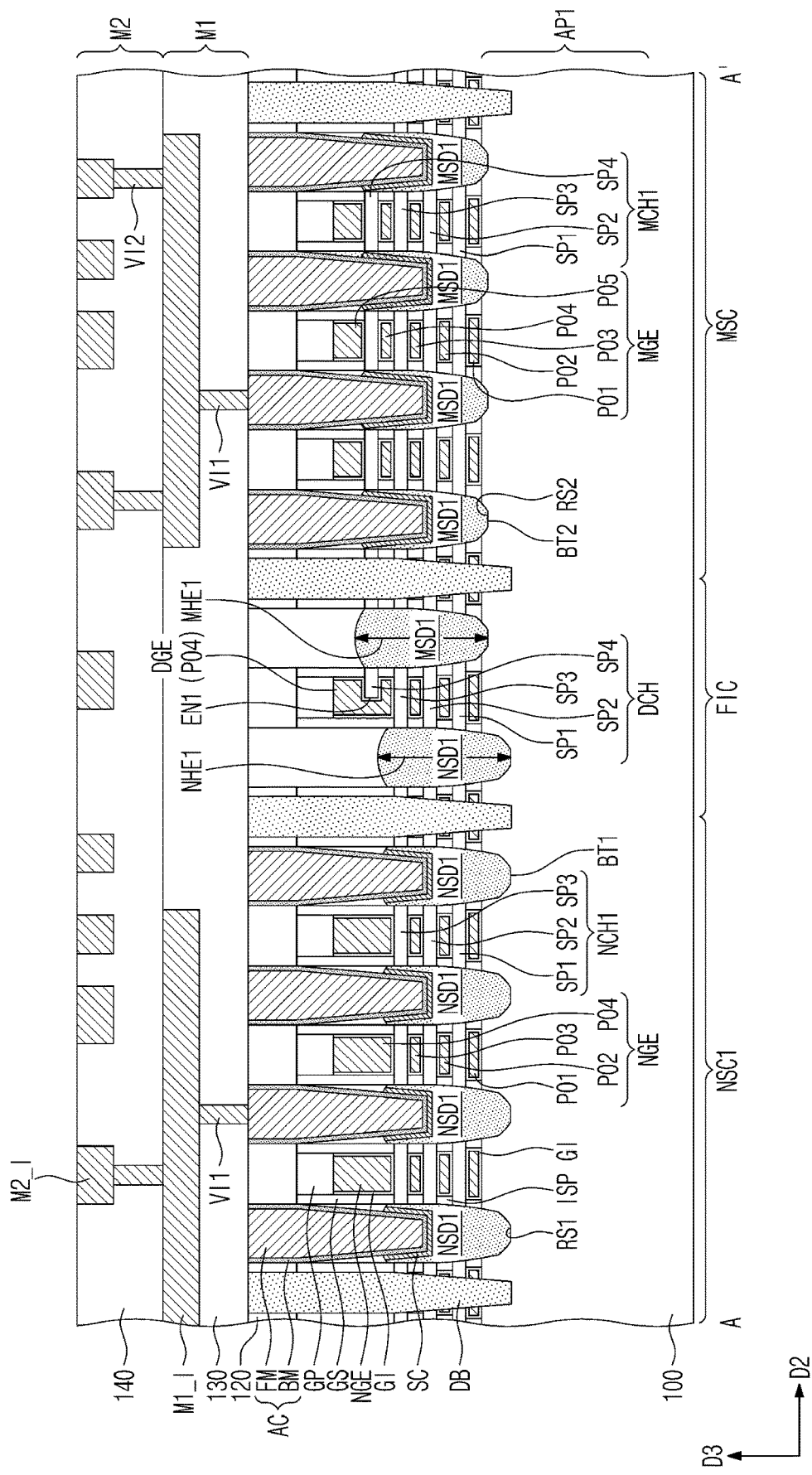
FIGS. 6A, 6B, 6C and 6D are cross-sectional views taken along lines A-A', B-B', C-C' and D-D' of FIG. 5, respectively.

The M-stack cell MSC may be adjacent to the first N-stack cell NSC1 in the second direction D2. A buffer cell FIC may be provided between the first N-stack cell NSC1 and the M-stack cell MSC. The second N-stack cell NSC2 may be adjacent to the third N-stack cell NSC3 in the second direction D2. The first N-stack cell NSC1, the buffer cell FIC and the M-stack cell MSC may be disposed in a first cell block CBL1. The second N-stack cell NSC2 and the third N-stack cell NSC3 may be disposed in a second cell block CBL2. As shown in FIG. 6A, the buffer cell FIC may be narrower, in the second direction D2, than each of the first N-stack cell NSC1 and the M-stack cell MSC.

A first active pattern AP1 and a second active pattern AP2 may be provided on the first cell block CBL1. A third active pattern AP3 and a fourth active pattern AP4 may be provided on the second cell block CBL2. Each of the first to fourth active patterns AP1 to AP4 may extend in the second direction D2. In some embodiments, the first and fourth active patterns AP1 and AP4 may be NMOSFET regions, and the second and third active patterns AP2 and AP3 may be PMOSFET regions. The first to fourth active patterns AP1 to AP4 may be portions of the substrate 100, which protrude vertically.

Figure 10A:
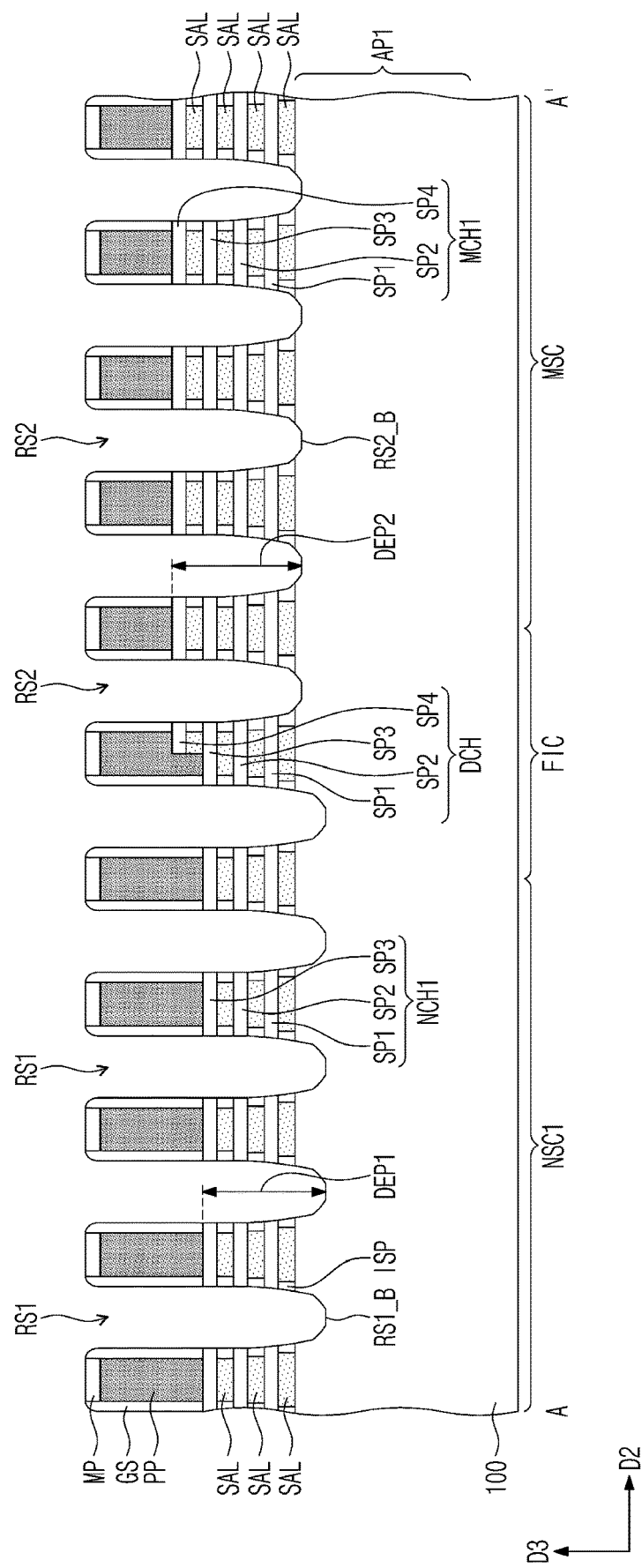
Figure 10B:
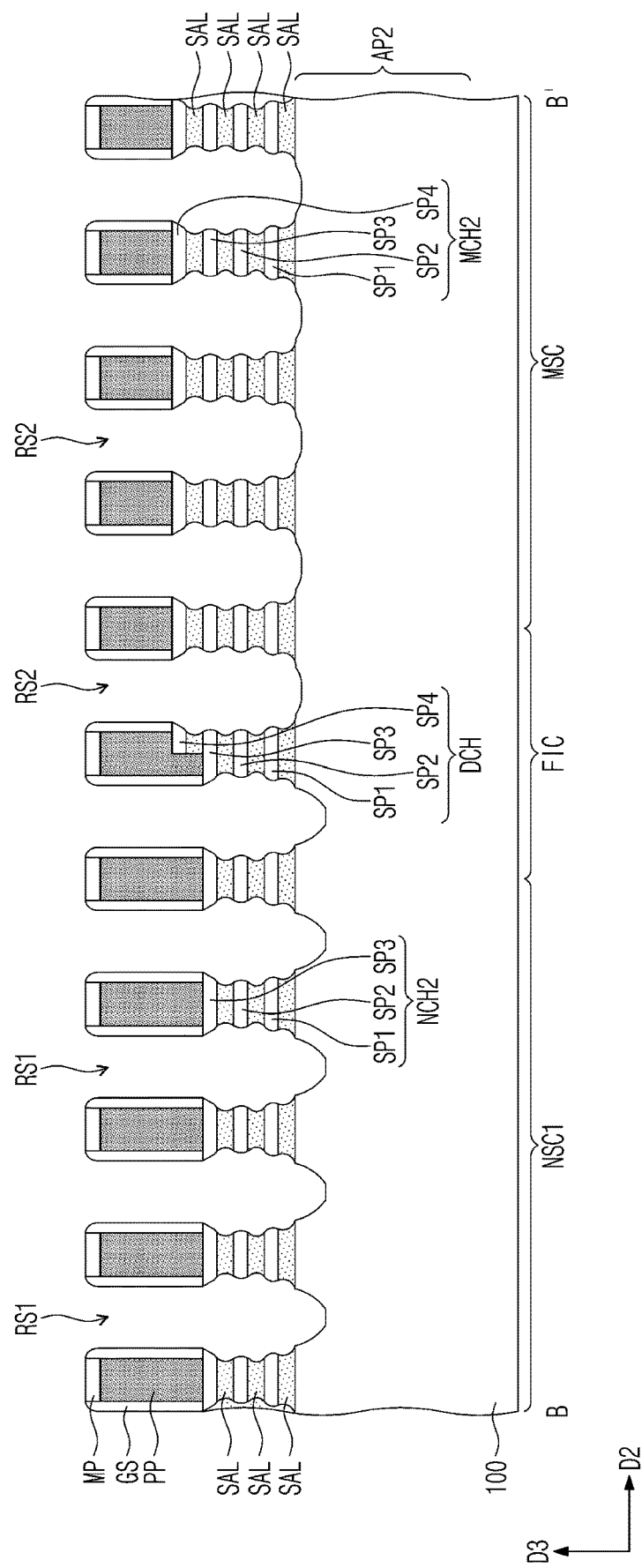
Figure 10C:
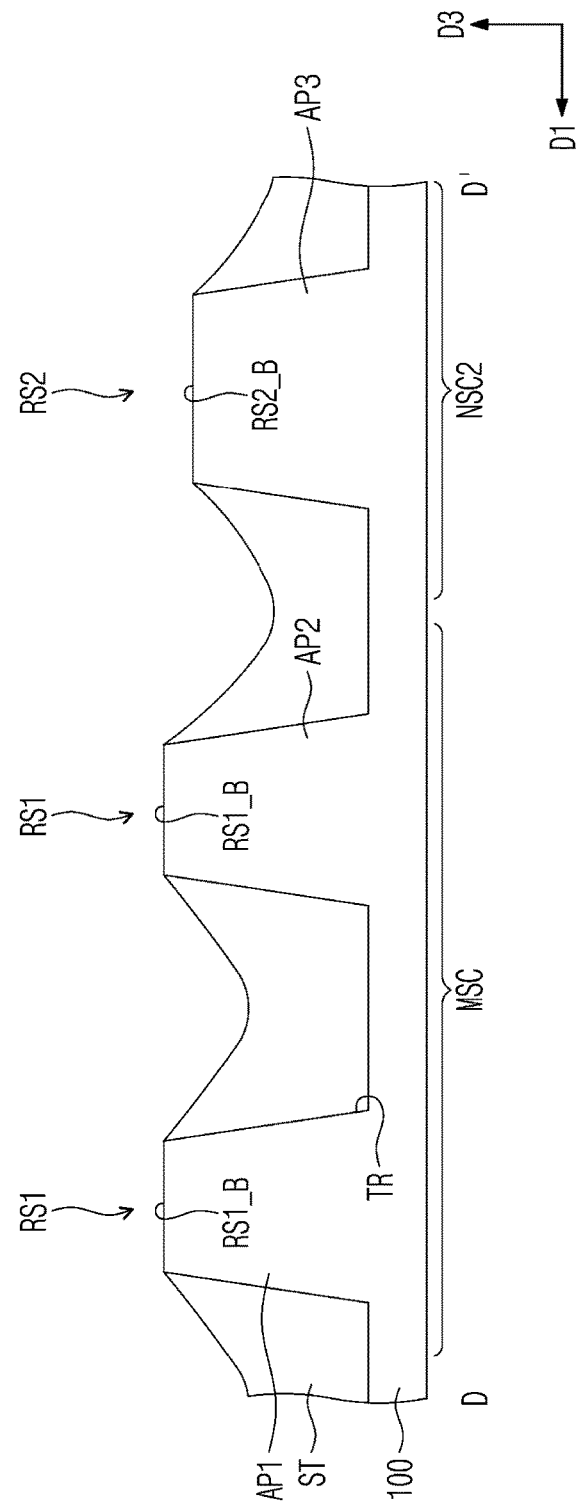
Figure 11A:
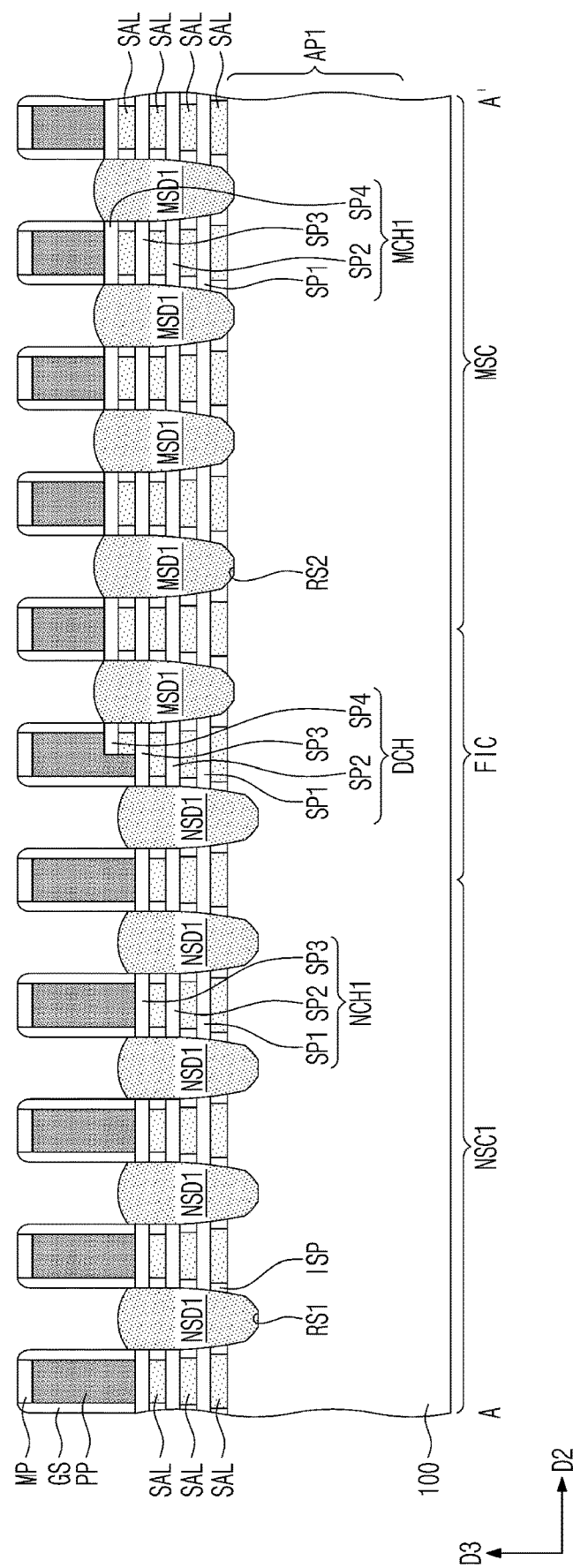
Figure 11B:
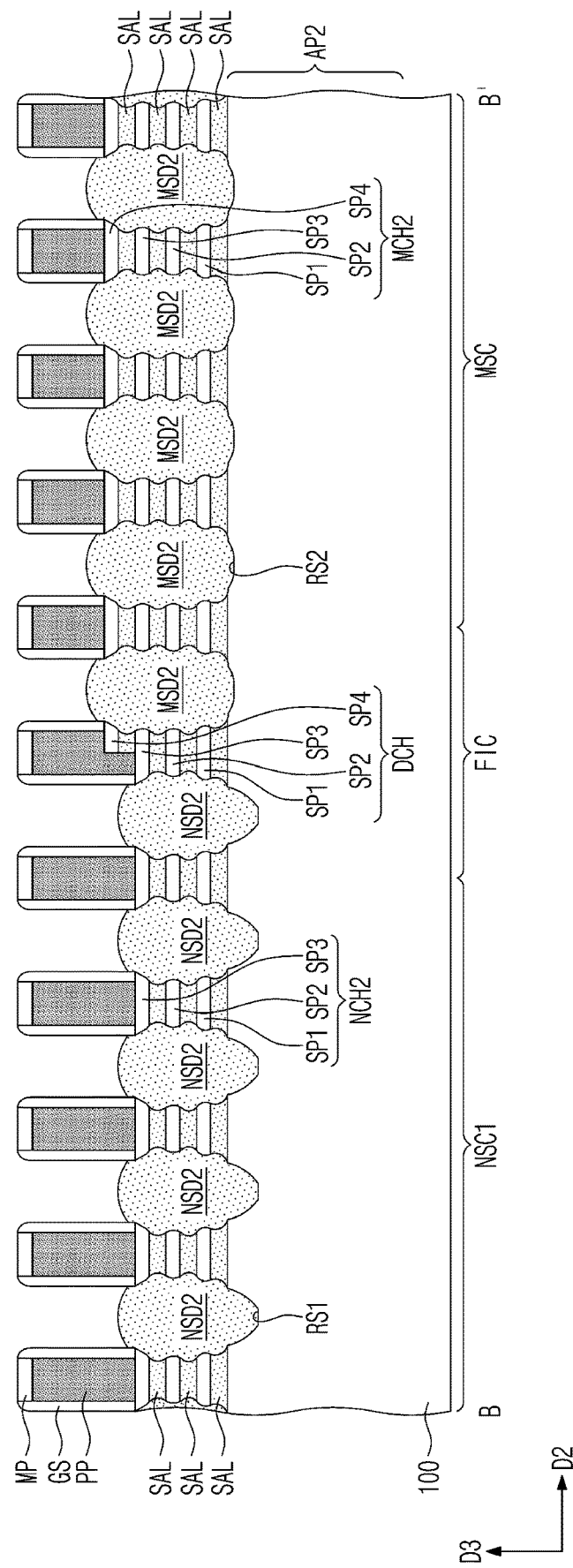
Figure 11C:
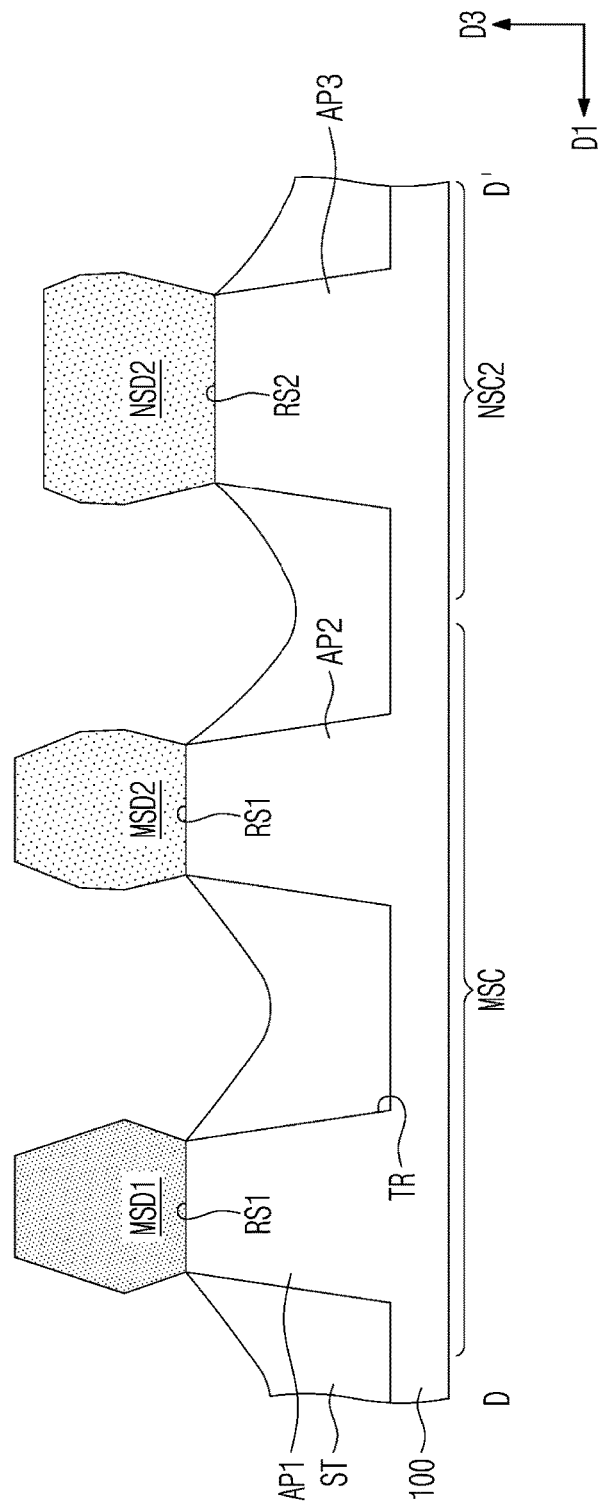

A trench TR (e.g., as shown in FIG. 10C) formed in an upper portion of the substrate 100 may define the first to fourth active patterns AP1 to AP4. In other words, the trench TR may be defined between the first to fourth active patterns AP1 to AP4. A device isolation layer ST may be provided on the substrate 100. The device isolation layer ST may be in (e.g., may fill) the trench TR. The device isolation layer ST may include a silicon oxide layer. The device isolation layer ST may not cover N-stack channel patterns NCH and M-stack channel patterns MCH to be described later.

Each of the first and second active patterns AP1 and AP2 of the first cell block CBL1 may have a first width W1 in the first direction D1. Each of the third and fourth active patterns AP3 and AP4 of the second cell block CBL2 may have a second width W2 in the first direction D1. In some embodiments, the second width W2 may be greater than the first width W1, as shown in FIG. 5.

A first N-stack channel pattern NCH1 may be provided on the first active pattern AP1 of the first N-stack cell NSC1. A second N-stack channel pattern NCH2 may be provided on the second active pattern AP2 of the first N-stack cell NSC1. Each of the first and second N-stack channel patterns NCH1 and NCH2 may include N nanosheets which are stacked.

For example, each of the first and second N-stack channel patterns NCH1 and NCH2 may include a first semiconductor pattern SP1, a second semiconductor pattern SP2 and a third semiconductor pattern SP3, which are sequentially stacked. In other words, each of the first and second N-stack channel patterns NCH1 and NCH2 may include three nanosheets. The first to third semiconductor patterns SP1, SP2 and SP3 may be spaced apart from each other in a vertical direction (i.e., a third direction D3).

Each of the first to third semiconductor patterns SP1, SP2 and SP3 may include silicon (Si), germanium (Ge), or silicon-germanium (SiGe). For example, each of the first to third semiconductor patterns SP1, SP2 and SP3 may include crystalline silicon, more particularly, single-crystalline silicon.

A first M-stack channel pattern MCH1 may be provided on the first active pattern AP1 of the M-stack cell MSC. A second M-stack channel pattern MCH2 may be provided on the second active pattern AP2 of the M-stack cell MSC. Each of the first and second M-stack channel patterns MCH1 and MCH2 may include M nanosheets which are stacked.

For example, each of the first and second M-stack channel patterns MCH1 and MCH2 may include a first semiconductor pattern SP1, a second semiconductor pattern SP2, a third semiconductor pattern SP3 and a fourth semiconductor pattern SP4, which are sequentially stacked. In other words, each of the first and second M-stack channel patterns MCH1 and MCH2 may include four nanosheets. The first to fourth semiconductor patterns SP1 to SP4 may be spaced apart from each other in the vertical direction (i.e., the third direction D3).

The first to third semiconductor patterns SP1 to SP3 of the M-stack channel pattern MCH1 or MCH2 may be located at the same heights as the first to third semiconductor patterns SP1 to SP3 of the N-stack channel pattern NCH1 or NCH2, respectively. The fourth semiconductor pattern SP4 of the M-stack channel pattern MCH1 or MCH2 may be located at a higher level than the third semiconductor pattern SP3 of the N-stack channel pattern NCH1 or NCH2.

Figure 6B:
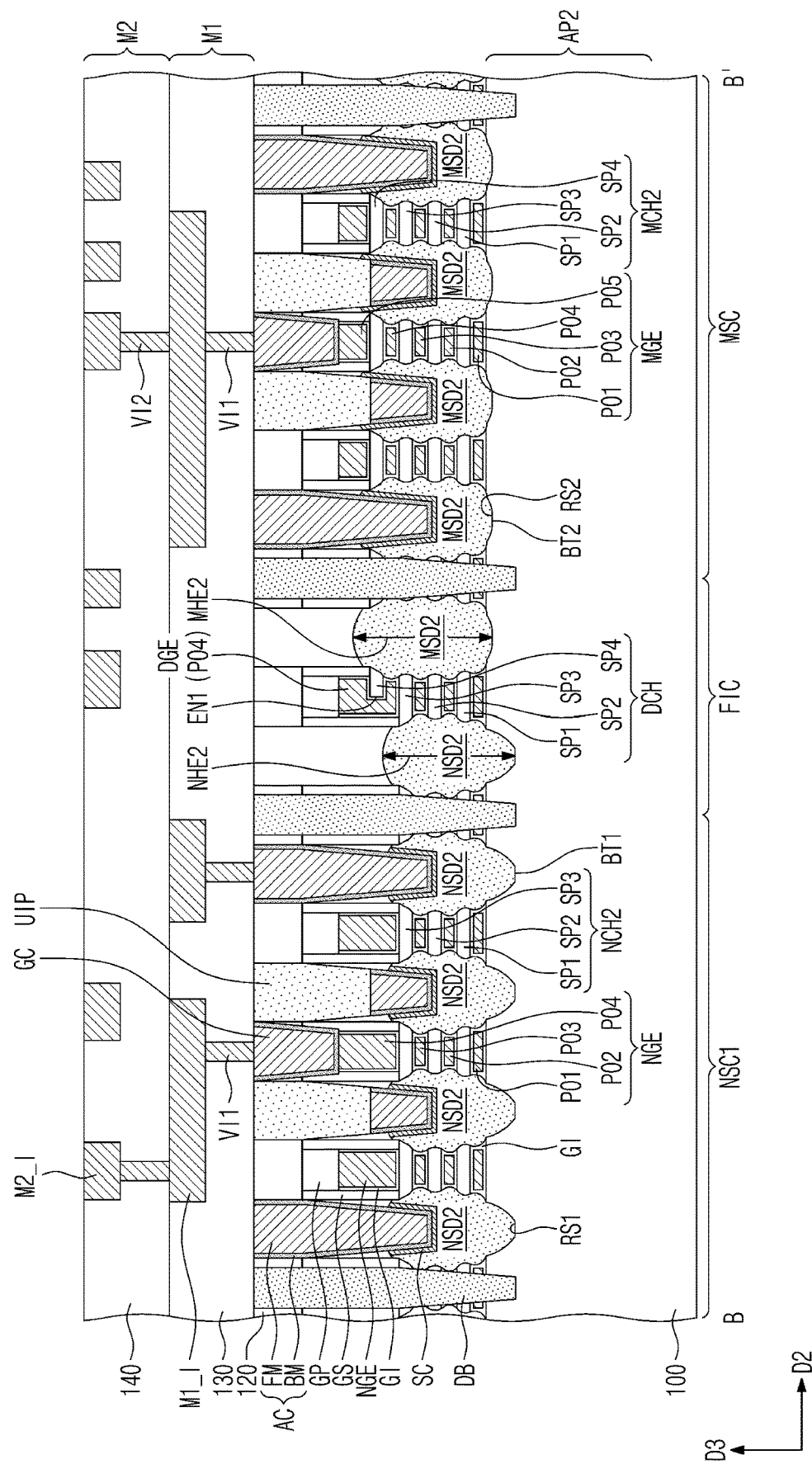
Figure 6C:
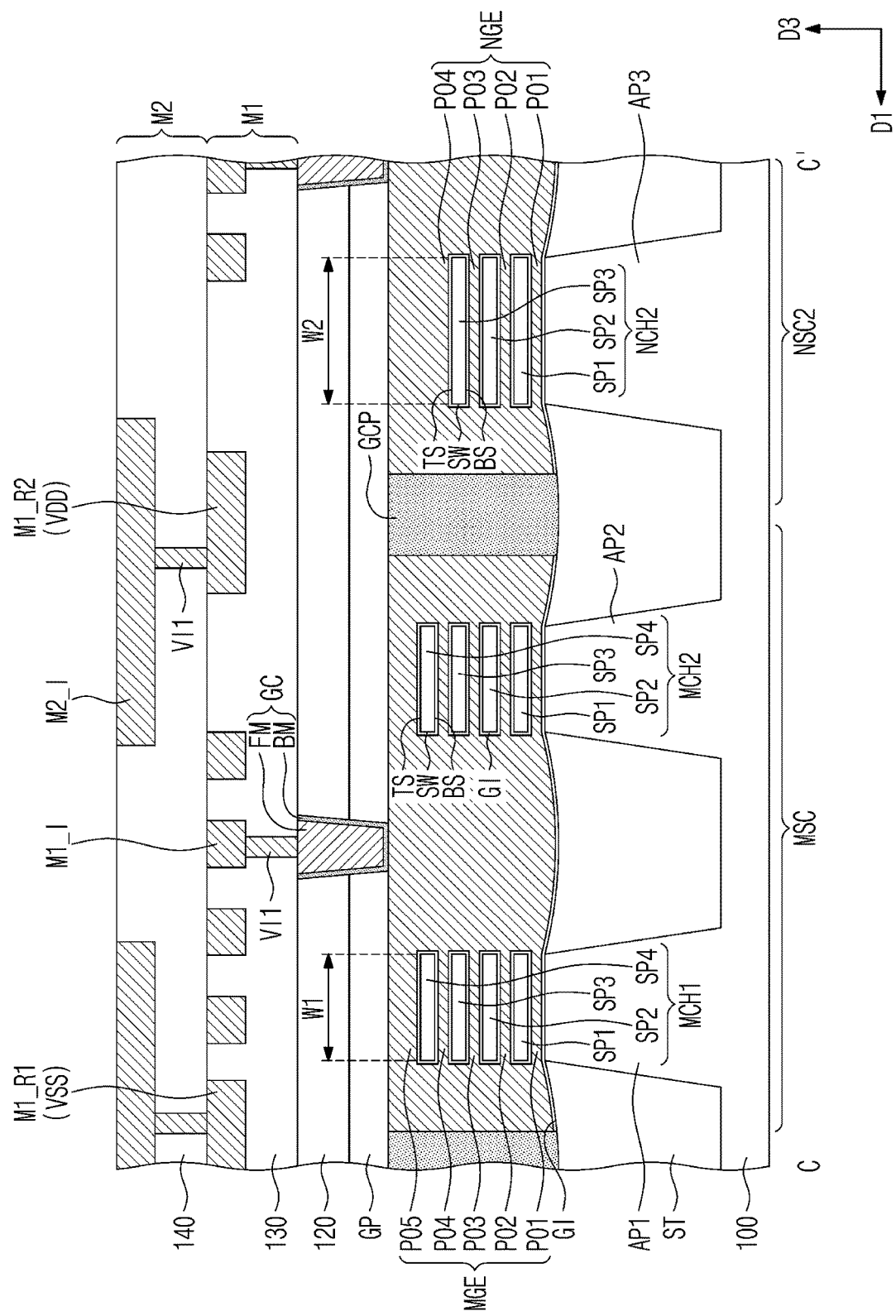

Referring to FIGS. 5 and 6C, each of the M-stack channel patterns MCH1 and MCH2 on the first and second active patterns AP1 and AP2 may have the first width W1 in the first direction D1. Each of N-stack channel patterns NCH1 and NCH2 on the third and fourth active patterns AP3 and AP4 may have the second width W2 in the first direction D1. In some embodiments, the second width W2 may be greater than the first width W1.

Referring again to FIGS. 5 and 6A to 6D, a dummy channel pattern DCH may be provided on each of the first and second active patterns AP1 and AP2 of the buffer cell FIC. In some embodiments, the dummy channel pattern DCH may include M nanosheets which are stacked. The dummy channel pattern DCH may include first to fourth semiconductor patterns SP1 to SP4 which are sequentially stacked. In other words, the dummy channel pattern DCH may include four nanosheets.

For example, the fourth semiconductor pattern SP4 corresponding to an uppermost portion of the dummy channel pattern DCH may be a cut nanosheet. For example, a length of the fourth semiconductor pattern SP4 in the second direction D2 may be less than a length of each of the first to third semiconductor patterns SP1 to SP3 in the second direction D2.

A plurality of first N-stack epitaxial patterns NSD1 may be provided on the first active pattern AP1 of the first N-stack cell NSC1. A plurality of first recesses RS1 may be defined on the first active pattern AP1 of the first N-stack cell NSC1. The plurality of first N-stack epitaxial patterns NSD1 may be provided in the plurality of first recesses RS1, respectively.

The first N-stack epitaxial patterns NSD1 may be source/drain regions having a first conductivity type (e.g., an n-type). The first N-stack channel pattern NCH1 may be disposed between a pair of the first N-stack epitaxial patterns NSD1. In other words, the stacked first to third semiconductor patterns SP1, SP2 and SP3 may electrically connect the pair of first N-stack epitaxial patterns NSD1 to each other.

A plurality of second N-stack epitaxial patterns NSD2 may be provided on the second active pattern AP2 of the first N-stack cell NSC1. A plurality of first recesses RS1 may be defined on the second active pattern AP2 of the first N-stack cell NSC1. The plurality of second N-stack epitaxial patterns NSD2 may be provided in the plurality of first recesses RS1, respectively.

The second N-stack epitaxial patterns NSD2 may be source/drain regions having a second conductivity type (e.g., a p-type). The second N-stack channel pattern NCH2 may be disposed between a pair of the second N-stack epitaxial patterns NSD2. In other words, the stacked first to third semiconductor patterns SP1, SP2 and SP3 may electrically connect the pair of second N-stack epitaxial patterns NSD2 to each other.

The first and second N-stack epitaxial patterns NSD1 and NSD2 may be formed using a selective epitaxial growth (SEG) process. In some embodiments, a top surface of each of the first and second N-stack epitaxial patterns NSD1 and NSD2 may be higher than a top surface of the third semiconductor pattern SP3. In some embodiments, the top surface of at least one of the first and second N-stack epitaxial patterns NSD1 and NSD2 may be located at substantially the same level as the top surface of the third semiconductor pattern SP3.

In some embodiments, the first N-stack epitaxial patterns NSD1 may include the same semiconductor element (e.g., Si) as the substrate 100. The second N-stack epitaxial patterns NSD2 may include a semiconductor element (e.g., SiGe) having a lattice constant greater than a lattice constant of the semiconductor element (e.g., Si) of the substrate 100. Thus, the pair of second N-stack epitaxial patterns NSD2 may provide a compressive stress to the second N-stack channel pattern NCH2 therebetween.

In some embodiments, a sidewall of the second N-stack epitaxial pattern NSD2 may have an uneven embossing shape. In other words, the sidewall of the second N-stack epitaxial pattern NSD2 may have a wave-shaped profile. The sidewall of the second N-stack epitaxial pattern NSD2 may protrude toward first to third portions PO1, PO2 and PO3 of an N-stack gate electrode NGE to be described later.

A plurality of first M-stack epitaxial patterns MSD1 may be provided on the first active pattern AP1 of the M-stack cell MSC. A plurality of second recesses RS2 may be defined on the first active pattern AP1 of the M-stack cell MSC. The plurality of first M-stack epitaxial patterns MSD1 may be provided in the plurality of second recesses RS2, respectively.

The first M-stack epitaxial patterns MSD1 may be source/drain regions having the first conductivity type (e.g., the n-type). The first M-stack channel pattern MCH1 may be disposed between a pair of the first M-stack epitaxial patterns MSD1. In other words, the stacked first to fourth semiconductor patterns SP1 to SP4 may electrically connect the pair of first M-stack epitaxial patterns MSD1 to each other.

A plurality of second M-stack epitaxial patterns MSD2 may be provided on the second active pattern AP2 of the M-stack cell MSC. A plurality of second recesses RS2 may be defined on the second active pattern AP2 of the M-stack cell MSC. The plurality of second M-stack epitaxial patterns MSD2 may be provided in the plurality of second recesses RS2, respectively.

The second M-stack epitaxial patterns MSD2 may be source/drain regions having the second conductivity type (e.g., the p-type). The second M-stack channel pattern MCH2 may be disposed between a pair of the second M-stack epitaxial patterns MSD2. In other words, the stacked first to fourth semiconductor patterns SP1 to SP4 may electrically connect the pair of second M-stack epitaxial patterns MSD2 to each other.

Figure 6D:
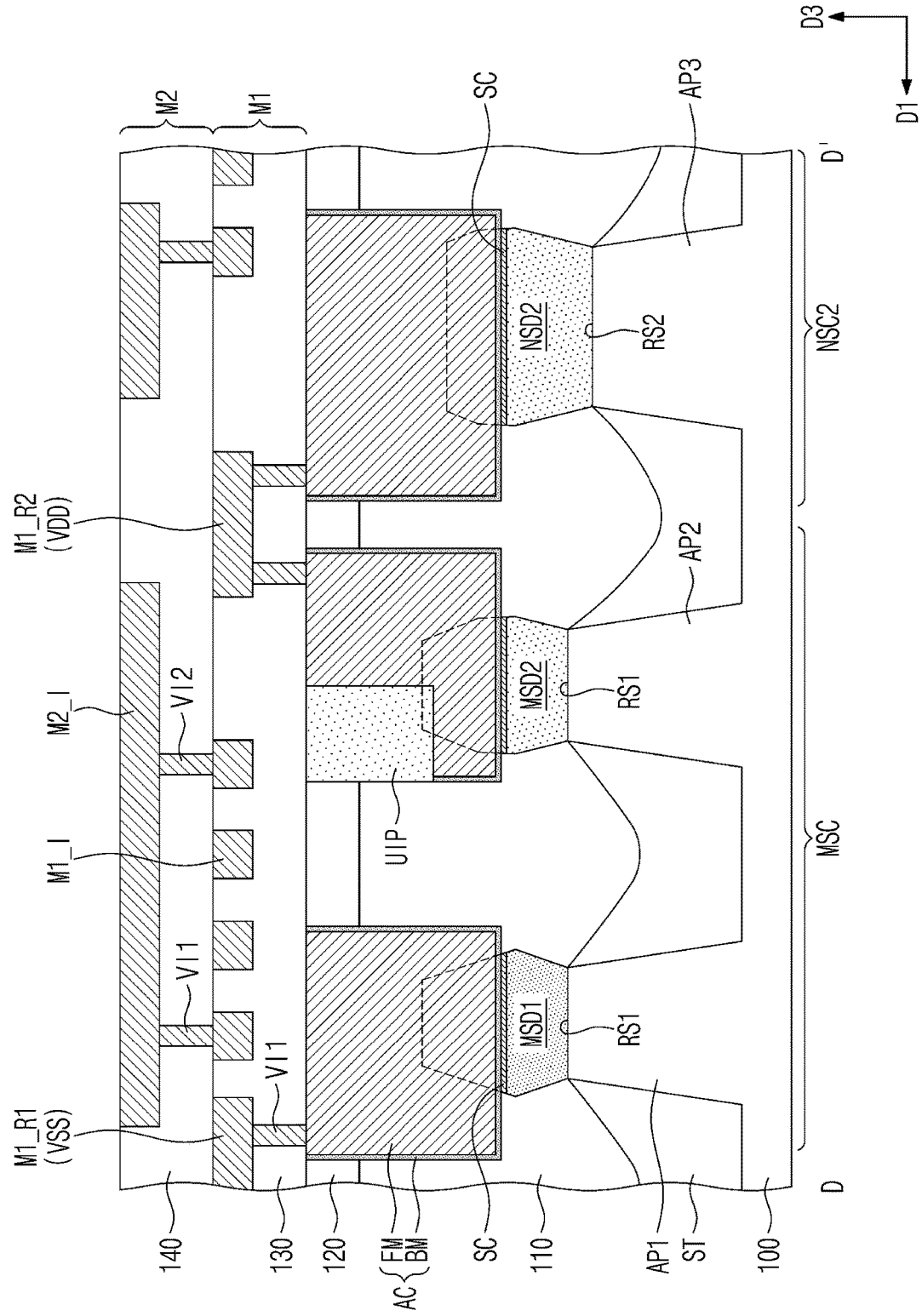

Referring to FIGS. 6A, 6B and 6D, a bottom of the first recess RS1 may be lower than a bottom of the second recess RS2. In other words, a bottom surface BT1 of each of the first and second N-stack epitaxial patterns NSD1 and NSD2 of the first N-stack cell NSC1 may be lower than a bottom surface BT2 of each of the first and second M-stack epitaxial patterns MSD1 and MSD2 of the M-stack cell MSC. A top surface of each of the first and second N-stack epitaxial patterns NSD1 and NSD2 of the first N-stack cell NSC1 may be lower than a top surface of each of the first and second M-stack epitaxial patterns MSD1 and MSD2 of the M-stack cell MSC.

In some embodiments, a height NHE1 of the first N-stack epitaxial pattern NSD1 of the first N-stack cell NSC1 may be substantially equal to a height MHE1 of the first M-stack epitaxial pattern MSD1 of the M-stack cell MSC (see FIG. 6A). In some embodiments, a height NHE2 of the second N-stack epitaxial pattern NSD2 of the first N-stack cell NSC1 may be substantially equal to a height MHE2 of the second M-stack epitaxial pattern MSD2 of the M-stack cell MSC (see FIG. 6B). Other features of the first and second M-stack epitaxial patterns MSD1 and MSD2 may be substantially the same as corresponding features of the first and second N-stack epitaxial patterns NSD1 and NSD2 described above.

Referring to FIGS. 6A and 6B, the first N-stack epitaxial pattern NSD1 and the first M-stack epitaxial pattern MSD1 may be provided on the first active pattern AP1 of the buffer cell FIC. The first N-stack epitaxial pattern NSD1 may be provided in the first recess RS1, and the first M-stack epitaxial pattern MSD1 may be provided in the second recess RS2. The dummy channel pattern DCH may be disposed between the first N-stack epitaxial pattern NSD1 and the first M-stack epitaxial pattern MSD1.

As described above, the first M-stack epitaxial pattern MSD1 may be located at a higher level than the first N-stack epitaxial pattern NSD1. The cut fourth semiconductor pattern SP4 of the dummy channel pattern DCH may be electrically connected to the first M-stack epitaxial pattern MSD1. The cut fourth semiconductor pattern SP4 of the dummy channel pattern DCH may not be electrically connected to the first N-stack epitaxial pattern NSD1. However, the first to third semiconductor patterns SP1 to SP3 of the dummy channel pattern DCH may electrically connect the first N-stack epitaxial pattern NSD1 and the first M-stack epitaxial pattern MSD1 to each other.

Referring again to FIGS. 5 and 6A to 6D, N-stack gate electrodes NGE may be provided on the first N-stack cell NSC1. Each of the N-stack gate electrodes NGE may be provided on the first and second N-stack channel patterns NCH1 and NCH2. Each of the N-stack gate electrodes NGE may intersect the first and second N-stack channel patterns NCH1 and NCH2 and may extend in the first direction D1. The N-stack gate electrodes NGE may be arranged (e.g., spaced apart from each other) at a first pitch in the second direction D2.

Each of the N-stack gate electrodes NGE may include a first portion PO1 disposed between the active pattern AP1 or AP2 and the first semiconductor pattern SP1, a second portion PO2 disposed between the first semiconductor pattern SP1 and the second semiconductor pattern SP2, a third portion PO3 disposed between the second semiconductor pattern SP2 and the third semiconductor pattern SP3, and a fourth portion PO4 on the third semiconductor pattern SP3.

Referring to FIG. 6C, the N-stack gate electrode NGE may be provided on a top surface TS, a bottom surface BS and both (i.e., opposite) sidewalls SW of each of the first to third semiconductor patterns SP1, SP2 and SP3. In other words, a transistor according to some embodiments may be a three-dimensional field-effect transistor (e.g., a MBCFET or a GAAFET) in which a gate electrode three-dimensionally surrounds a channel.

M-stack gate electrodes MGE may be provided on the M-stack cell MSC. Each of the M-stack gate electrodes MGE may be provided on the first and second M-stack channel patterns MCH1 and MCH2. Each of the M-stack gate electrodes MGE may intersect the first and second M-stack channel patterns MCH1 and MCH2 and may extend in the first direction D1. The M-stack gate electrodes MGE may be arranged (e.g., spaced apart from each other) at the first pitch in the second direction D2.

Each of the M-stack gate electrodes MGE may include a first portion PO1 disposed between the active pattern AP1 or AP2 and the first semiconductor pattern SP1, a second portion PO2 disposed between the first semiconductor pattern SP1 and the second semiconductor pattern SP2, a third portion PO3 disposed between the second semiconductor pattern SP2 and the third semiconductor pattern SP3, a fourth portion PO4 disposed between the third semiconductor pattern SP3 and the fourth semiconductor pattern SP4, and a fifth portion PO5 on the fourth semiconductor pattern SP4. Referring to FIG. 6C, the M-stack gate electrode MGE may be provided on a top surface TS, a bottom surface BS and both (i.e., opposite) sidewalls SW of each of the first to fourth semiconductor patterns SP1 to SP4.

A dummy gate electrode DGE may be provided on the buffer cell FIC. The dummy gate electrode DGE may be provided on the dummy channel pattern DCH. The dummy gate electrode DGE may extend in the first direction D1. According to some embodiments, the dummy gate electrode DGE may include first to fourth portions PO1 to PO4, similarly to the N-stack gate electrodes NGE.

The fourth portion PO4 of the dummy gate electrode DGE may surround one end EN1 of the cut fourth semiconductor pattern SP4 (see FIGS. 6A and 6B). In other words, the fourth semiconductor pattern SP4 of the dummy channel pattern DCH may have a shape buried in (i.e., extending into) the fourth portion PO4 of the dummy gate electrode DGE.

Inner spacers ISP may be disposed between the first N-stack epitaxial pattern NSD1 and the first to third portions PO1, PO2 and PO3 of the N-stack gate electrode NGE, respectively, on the first active pattern AP1. The inner spacers ISP may also be disposed between the first M-stack epitaxial pattern MSD1 and the first to fourth portions PO1 to PO4 of the M-stack gate electrode MGE, respectively, on the first active pattern AP1. The inner spacer ISP may impede/prevent a leakage current from the gate electrode to the source/drain region. The inner spacer ISP may include a silicon-based insulating material (e.g., silicon oxide or silicon nitride).

A pair of gate spacers GS may be disposed on both (i.e., opposite) sidewalls of the fourth portion PO4 of the N-stack gate electrode NGE, respectively. The gate spacers GS may extend along the N-stack gate electrode NGE in the first direction D1. Top surfaces of the gate spacers GS may be higher than a top surface of the N-stack gate electrode NGE. The top surfaces of the gate spacers GS may be coplanar with a top surface of a first interlayer insulating layer 110 to be described later. For example, the gate spacers GS may include at least one of silicon carbonitride (SiCN), silicon carbon oxynitride (SiCON), or silicon nitride (SiN). For certain examples, each of the gate spacers GS may include a multi-layer formed of at least two of SiCN, SiCON, or SiN. A pair of the gate spacers GS may also be disposed on both (i.e., opposite) sidewalls of the fifth portion PO5 of the M-stack gate electrode MGE, respectively.

A gate capping pattern GP may be provided on the N-stack gate electrode NGE. The gate capping pattern GP may extend along the N-stack gate electrode NGE in the first direction D1. The gate capping pattern GP may include a material having an etch selectivity with respect to first and second interlayer insulating layers 110 and 120 to be described later. For example, the gate capping pattern GP may include at least one of silicon oxynitride (SiON), SiCN, SiCON, or SiN. The gate capping pattern GP may also be provided on the M-stack gate electrode MGE.

A gate insulating layer GI may be disposed between the N-stack gate electrode NGE and the N-stack channel patterns NCH1 and NCH2. The gate insulating layer GI may cover the top surface TS, the bottom surface BS and both (i.e., opposite) sidewalls SW of each of the first to third semiconductor patterns SP1, SP2 and SP3 (see FIG. 6C). The gate insulating layer GI may cover a top surface of the device isolation layer ST under the N-stack gate electrode NGE.

The gate insulating layer GI may also be disposed between the M-stack gate electrode MGE and the M-stack channel patterns MCH1 and MCH2. The gate insulating layer GI may cover the top surface TS, the bottom surface BS and both (i.e., opposite) sidewalls SW of each of the first to fourth semiconductor patterns SP1 to SP4 (see FIG. 6C). The gate insulating layer GI may cover a top surface of the device isolation layer ST under the M-stack gate electrode MGE.

In some embodiments, the gate insulating layer GI may include a silicon oxide layer, a silicon oxynitride layer, and/or a high-k dielectric layer. For example, the gate insulating layer GI may have a structure in which the silicon oxide layer and the high-k dielectric layer are stacked. The high-k dielectric layer may include a high-k dielectric material having a dielectric constant higher than that of the silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The N-stack gate electrode NGE may include a first metal pattern and a second metal pattern on the first metal pattern. The first metal pattern may be provided on the gate insulating layer GI and may be adjacent to the first to third semiconductor patterns SP1, SP2 and SP3. The first metal pattern may include a work function metal of adjusting a threshold voltage of a transistor. A desired threshold voltage of the transistor may be obtained by adjusting a thickness and a composition of the first metal pattern. For example, the first to third portions PO1, PO2 and PO3 of the N-stack gate electrode NGE may be formed of the first metal pattern including the work function metal.

The first metal pattern may include a metal nitride layer. For example, the first metal pattern may include nitrogen (N) and at least one metal selected from a group consisting of titanium (Ti), tantalum (Ta), aluminum (Al), tungsten (W), and molybdenum (Mo). In addition, the first metal pattern may further include carbon (C). In some embodiments, the first metal pattern may include a plurality of stacked work function metal layers.

The second metal pattern may include a metal having a resistance lower than that of the first metal pattern. For example, the second metal pattern may include at least one metal selected from a group consisting of tungsten (W), aluminum (Al), titanium (Ti), and tantalum (Ta). For example, the fourth portion PO4 of the N-stack gate electrode NGE may include the first metal pattern and the second metal pattern on the first metal pattern.

The M-stack gate electrode MGE may also include the first metal pattern and the second metal pattern on the first metal pattern. The first metal pattern may be provided on the gate insulating layer GI and may be adjacent to the first to fourth semiconductor patterns SP1 to SP4. For example, the first to fourth portions PO1 to PO4 of the M-stack gate electrode MGE may be formed of the first metal pattern including the work function metal. The fifth portion PO5 of the M-stack gate electrode MGE may include the first metal pattern and the second metal pattern on the first metal pattern.

Referring to FIGS. 5 and 6C, a gate cutting pattern GCP may be provided between the M-stack gate electrode MGE of the M-stack cell MSC and the N-stack gate electrode NGE of the second N-stack cell NSC2. The M-stack gate electrode MGE of the M-stack cell MSC and the N-stack gate electrode NGE of the second N-stack cell NSC2 may be aligned with each other in the first direction D1. The gate cutting pattern GCP may separate (e.g., electrically isolate) the M-stack gate electrode MGE and the N-stack gate electrode NGE from each other. For example, the gate cutting pattern GCP may be disposed between the second M-stack channel pattern MCH2 having four nanosheets and the second N-stack channel pattern NCH2 having three nanosheets. The gate cutting pattern GCP may include a silicon-based insulating material (e.g., silicon nitride).

Referring again to FIGS. 5 and 6A to 6D, a first interlayer insulating layer 110 may be provided on the substrate 100. The first interlayer insulating layer 110 may cover the gate spacers GS and the N-stack and M-stack epitaxial patterns NSD and MSD. A top surface of the first interlayer insulating layer 110 may be substantially coplanar with a top surface of the gate capping pattern GP and the top surface of the gate spacer GS. A second interlayer insulating layer 120 covering the gate capping pattern GP may be disposed on the first interlayer insulating layer 110. A third interlayer insulating layer 130 may be provided on the second interlayer insulating layer 120. A fourth interlayer insulating layer 140 may be provided on the third interlayer insulating layer 130. For example, each of the first to fourth interlayer insulating layers 110 to 140 may include a silicon oxide layer.

An isolation structure DB may be provided between the first N-stack cell NSC1 and the buffer cell FIC. The isolation structure DB may also be provided between the buffer cell FIC and the M-stack cell MSC. The isolation structure DB may extend in the first direction D1 in parallel to the N-stack and M-stack gate electrodes NGE and MGE. A pitch between the isolation structure DB and the N-stack gate electrode NGE adjacent thereto may be equal to the first pitch. A pitch between the isolation structure DB and the M-stack gate electrode MGE adjacent thereto may be equal to the first pitch. A pitch between the isolation structure DB and the dummy gate electrode DGE adjacent thereto may be equal to the first pitch.

The isolation structure DB may penetrate the first and second interlayer insulating layers 110 and 120 and may extend into the first and second active patterns AP1 and AP2. The isolation structure DB may penetrate an upper portion of each of the first and second active patterns AP1 and AP2. The isolation structure DB may electrically isolate active patterns of the logic cells adjacent to each other. For example, the isolation structure DB may be the single diffusion break disposed at the cell boundary CBD described above with respect to FIG. 3.

Active contacts AC may penetrate the first and second interlayer insulating layers 110 and 120 so as to be electrically connected to the N-stack and M-stack epitaxial patterns NSD and MSD, respectively. Each of the active contacts AC may have a bar shape extending in the first direction D1 when viewed in a plan view.

The active contact AC may be a self-aligned contact. In other words, the active contact AC may be formed to be self-aligned with the gate capping pattern GP and the gate spacer GS. For example, the active contact AC may cover at least a portion of a sidewall of the gate spacer GS. Even though not shown in the drawings, the active contact AC may cover a portion of the top surface of the gate capping pattern GP.

Metal-semiconductor compound layers SC may be disposed between the active contacts AC and the N-stack and M-stack epitaxial patterns NSD and MSD, respectively. For example, the metal-semiconductor compound layer SC may include at least one of titanium silicide, tantalum silicide, tungsten silicide, nickel silicide, or cobalt silicide. The active contact AC may be electrically connected to the epitaxial pattern (i.e., the source/drain region) through the metal-semiconductor compound layer SC.

Gate contacts GC may penetrate the second interlayer insulating layer 120 and the gate capping pattern GP so as to be electrically connected to the N-stack and M-stack gate electrodes NGE and MGE, respectively. In some embodiments, referring to FIG. 6B, an upper portion of the active contact AC adjacent to the gate contact GC may be replaced (e.g., be filled) with an upper insulating pattern UIP. A bottom surface of the upper insulating pattern UIP may be lower than a bottom surface of the gate contact GC. In other words, a top surface of the active contact AC adjacent to the gate contact GC may be lower than the bottom surface of the gate contact GC due to the upper insulating pattern UIP. Thus, it is possible to impede/prevent an electrical short between the gate contact GC and the active contact AC adjacent thereto.

Each of the active contact AC and the gate contact GC may include a conductive pattern FM and a barrier pattern BM surrounding the conductive pattern FM. For example, the conductive pattern FM may include at least one metal of aluminum, copper, tungsten, molybdenum, or cobalt. The barrier pattern BM may cover sidewalls and a bottom surface of the conductive pattern FM. The barrier pattern BM may include a metal layer/a metal nitride layer. The metal layer may include at least one of titanium, tantalum, tungsten, nickel, cobalt, or platinum. The metal nitride layer may include at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

A first metal layer M1 may be provided in the third interlayer insulating layer 130. For example, the first metal layer M1 may include first to third power interconnection lines M1_R1, M1_R2 and M1_R3 and first interconnection lines M1_I. The interconnection lines M1_R1, M1_R2, M1_R3 and M1_I of the first metal layer M1 may extend in the second direction D2 in parallel to each other. The first interconnection lines M1_I of the first metal layer M1 may be disposed between the first to third power interconnection lines M1_R1, M1_R2 and M1_R3. A line width of each of the first interconnection lines M1_I may be less than a line width of each of the first to third power interconnection lines M1_R1, M1_R2 and M1_R3.

The first metal layer M1 may further include first vias VI1. The first vias VI1 may be provided under the interconnection lines M1_R1, M1_R2, M1_R3 and M1_I of the first metal layer M1. The active contact AC may be electrically connected to a corresponding one of the interconnection lines of the first metal layer M1 through a corresponding one of the first vias VI1. The gate contact GC may be electrically connected to a corresponding one of the interconnection lines of the first metal layer M1 through a corresponding one of the first vias VI1.

The interconnection line of the first metal layer M1 and the first via VI1 thereunder may be formed using different processes. In other words, each of the interconnection line and the first via VI1 of the first metal layer M1 may be formed using a single damascene process. The semiconductor device according to some embodiments may be formed using processes less than 20 nanometers (nm).

A second metal layer M2 may be provided in the fourth interlayer insulating layer 140. The second metal layer M2 may include a plurality of second interconnection lines M2_I. Each of the second interconnection lines M2_I of the second metal layer M2 may have a line shape or bar shape extending in the first direction D1. In other words, the second interconnection lines M2_I may extend in the first direction D1 in parallel to each other.

The second metal layer M2 may further include second vias VI2 provided under the second interconnection lines M2_I. The interconnection lines of the first metal layer M1 may be electrically connected to the interconnection lines of the second metal layer M2 through the second vias VI2. For example, the interconnection line of the second metal layer M2 and the second via VI2 thereunder may be formed together by a dual damascene process.

The interconnection lines of the first metal layer M1 and the interconnection lines of the second metal layer M2 may include the same conductive material or different conductive materials. For example, the interconnection lines of the first metal layer M1 and the interconnection lines of the second metal layer M2 may include at least one metal material of aluminum, copper, tungsten, molybdenum, ruthenium, or cobalt. Even though not shown in the drawings, metal layers (e.g., third, fourth, fifth, or more metal layers) stacked on the fourth interlayer insulating layer 140 may be additionally provided. Each of the stacked metal layers may include interconnection lines for routing between the logic cells.

FIGS. 7A to 13C are cross-sectional views illustrating a method of manufacturing a semiconductor device according to some embodiments of the inventive concepts. More particularly, FIGS. 7A, 8A, 9A, 10A, 11A, 12A and 13A are cross-sectional views corresponding to the line A-A' of FIG. 5. FIGS. 10B, 11B, 12B and 13B are cross-sectional views corresponding to the line B-B' of FIG. 5. FIGS. 7B, 8B, 9B, 12C and 13C are cross-sectional views corresponding to the line C-C' of FIG. 5. FIGS. 10C and 11C are cross-sectional views corresponding to the line D-D' of FIG. 5.

Figure 7A:
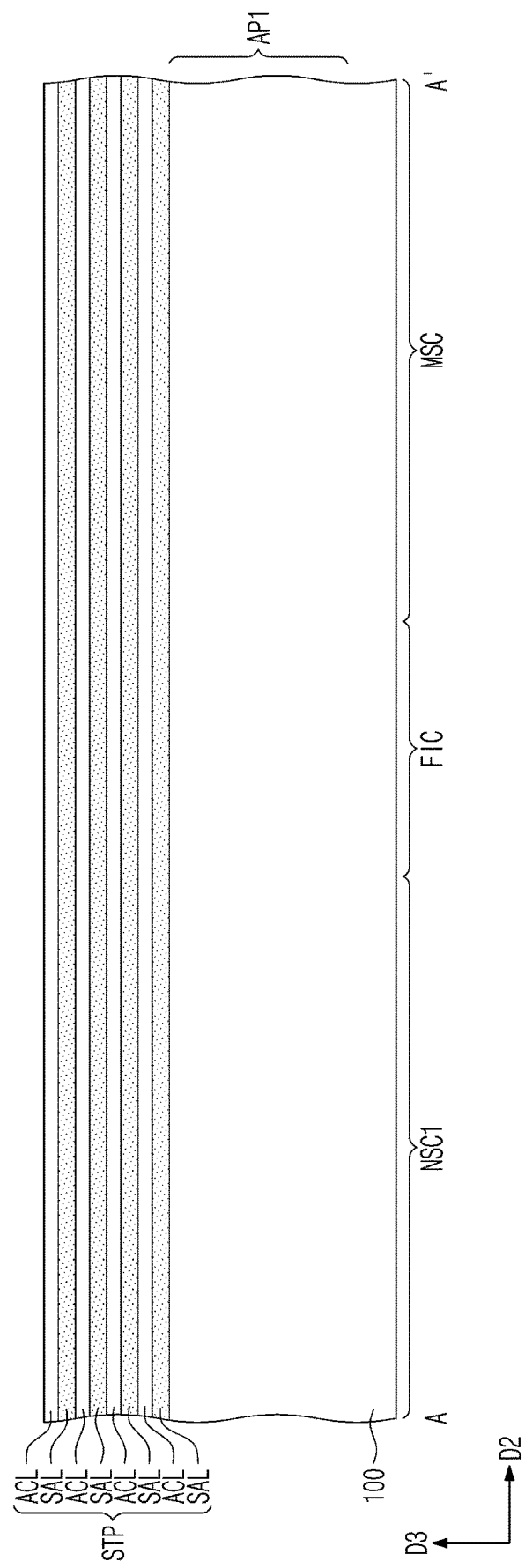
Figure 7B:
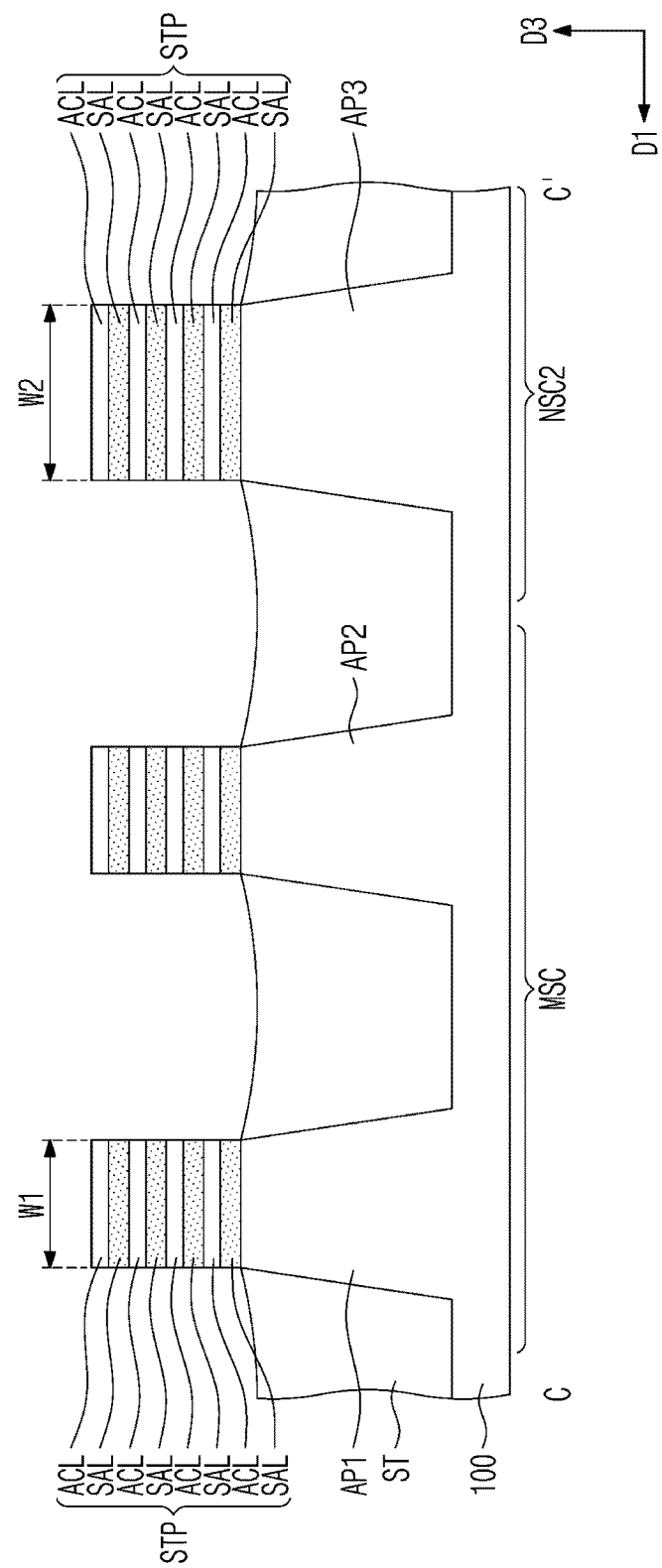

Referring to FIGS. 5, 7A and 7B, a substrate 100 including first to third N-stack cells NSC1, NSC2 and NSC3, an M-stack cell MSC and a buffer cell FIC may be provided. Active layers ACL and sacrificial layers SAL may be formed to be alternately stacked on the substrate 100. In some embodiments, M active layers ACL may be stacked, and M sacrificial layers SAL may be stacked. For example, the number 'M' may be four. The active layers ACL may include one of silicon (Si), germanium (Ge) and silicon-germanium (SiGe), and the sacrificial layers SAL may include another (i.e., a different one) of silicon (Si), germanium (Ge) and silicon-germanium (SiGe).

The sacrificial layers SAL may include a material having an etch selectivity with respect to the active layers ACL. For example, the active layers ACL may include silicon (Si), and the sacrificial layers SAL may include silicon-germanium (SiGe). A concentration of germanium (Ge) of each of the sacrificial layers SAL may range from 10 atomic percent (at %) to 30 at %.

An etching process may be performed on the substrate 100 to form first to fourth active patterns AP1 to AP4. A trench TR defining the first to fourth active patterns AP1 to AP4 may be formed in an upper portion of the substrate 100. Each of the first to fourth active patterns AP1 to AP4 may have a line shape or bar shape extending in the second direction D2.

A stack pattern STP may be formed on each of the first to fourth active patterns AP1 to AP4. The stack pattern STP may include the active layers ACL and the sacrificial layers SAL, which are alternately stacked. The stack pattern STP may be formed together with the first to fourth active patterns AP1 to AP4 in the etching process.

A first width W1, in the first direction D1, of each of the first and second active patterns AP1 and AP2 may be less than a second width W2, in the first direction D1, of each of the third and fourth active patterns AP3 and AP4. The stack pattern STP on each of the first and second active patterns AP1 and AP2 may have the first width W1. The stack pattern STP on each of the third and fourth active patterns AP3 and AP4 may have the second width W2 greater than the first width W1.

A device isolation layer ST in (e.g., filling) the trench TR may be formed. More particularly, an insulating layer covering the first to fourth active patterns AP1 to AP4 and the stack patterns STP may be formed on an entire top surface of the substrate 100. The insulating layer may be recessed until the stack patterns STP are exposed, thereby forming the device isolation layer ST.

The device isolation layer ST may include an insulating material (e.g., silicon oxide). The stack patterns STP may be exposed above the device isolation layer ST. In other words, the stack patterns STP may vertically protrude above the device isolation layer ST.

Figure 8B:
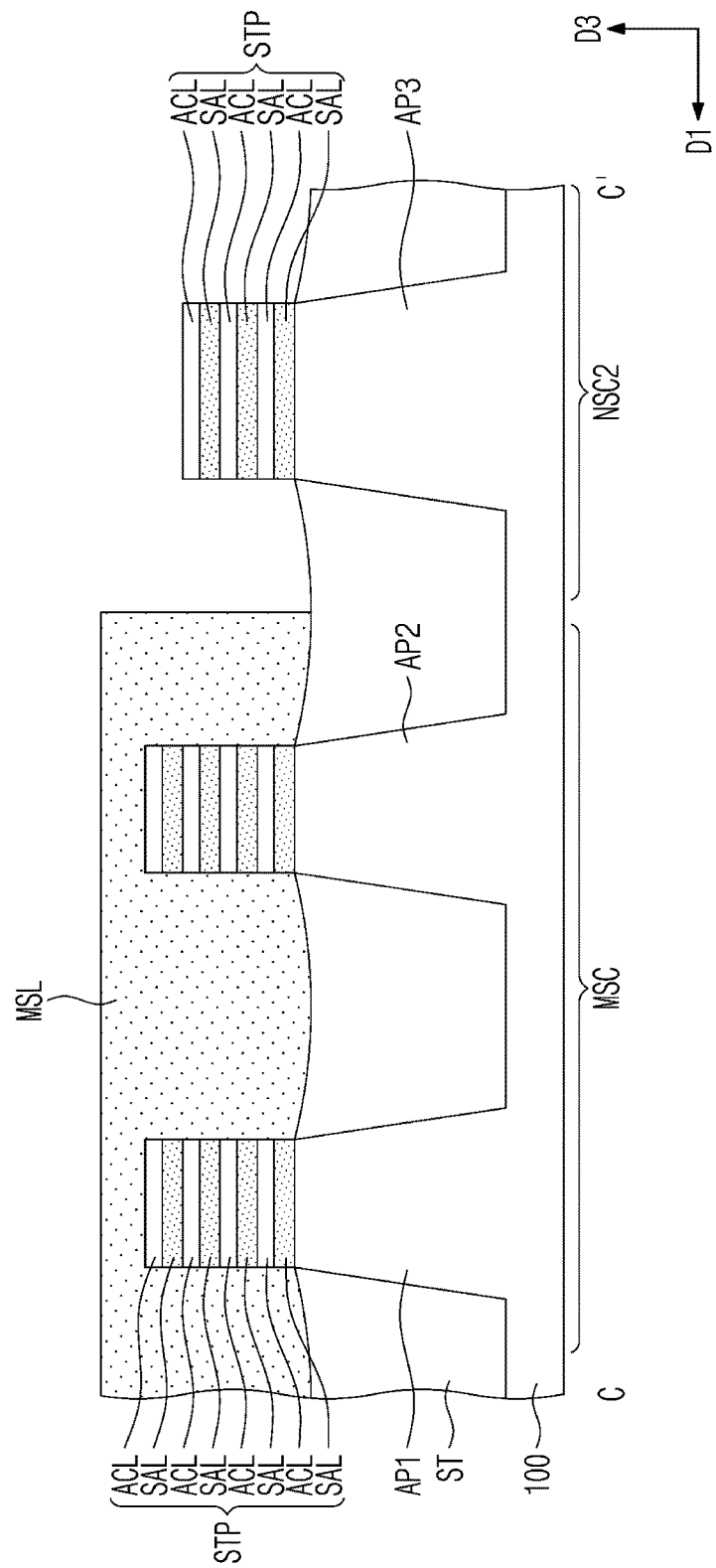

Referring to FIGS. 5, 8A and 8B, a mask layer MSL may be formed on the M-stack cell MSC. The mask layer MSL may be formed to expose the first to third N-stack cells NSC1, NSC2 and NSC3. The mask layer MSL may be formed to completely cover the M-stack cell MSC. A portion of the mask layer MSL may be formed on the buffer cell FIC. The mask layer MSL may be formed to overlap with a portion of the buffer cell FIC in the third direction D3.

An uppermost active layer ACL and an uppermost sacrificial layer SAL of the exposed stack pattern STP may be removed using the mask layer MSL as an etch mask. Thus, the stack pattern STP on each of the first to third N-stack cells NSC1, NSC2 and NSC3 may include N active layers ACL and N sacrificial layers SAL. The number 'N' may be smaller than the number 'M'. For example, the number 'N' may be three.

Referring again to FIG. 8A, the number of the active layers ACL of the stack pattern STP may transition from the number 'M' to the number 'N' in the buffer cell FIC. In other words, the buffer cell FIC may be a structural buffer region in which a height of the stack pattern STP is changed along the second direction D2.

Figure 9A:
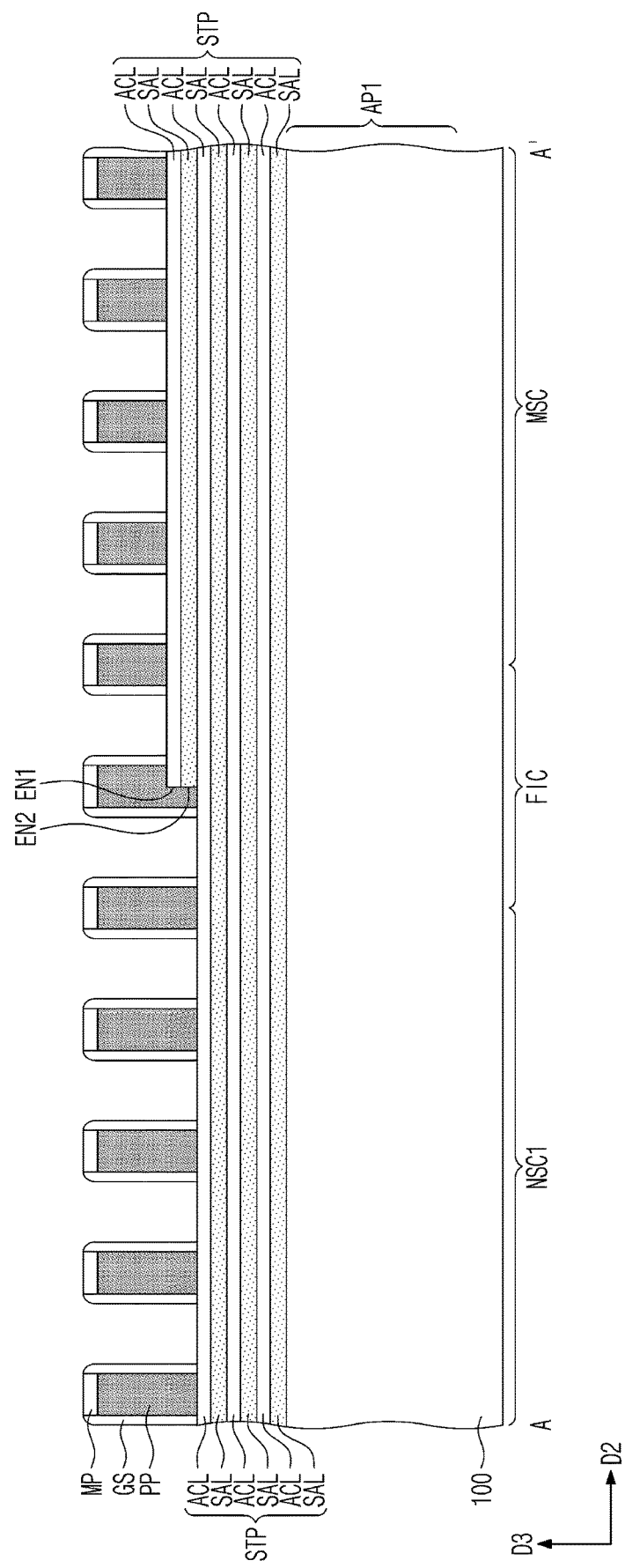
Figure 9B:
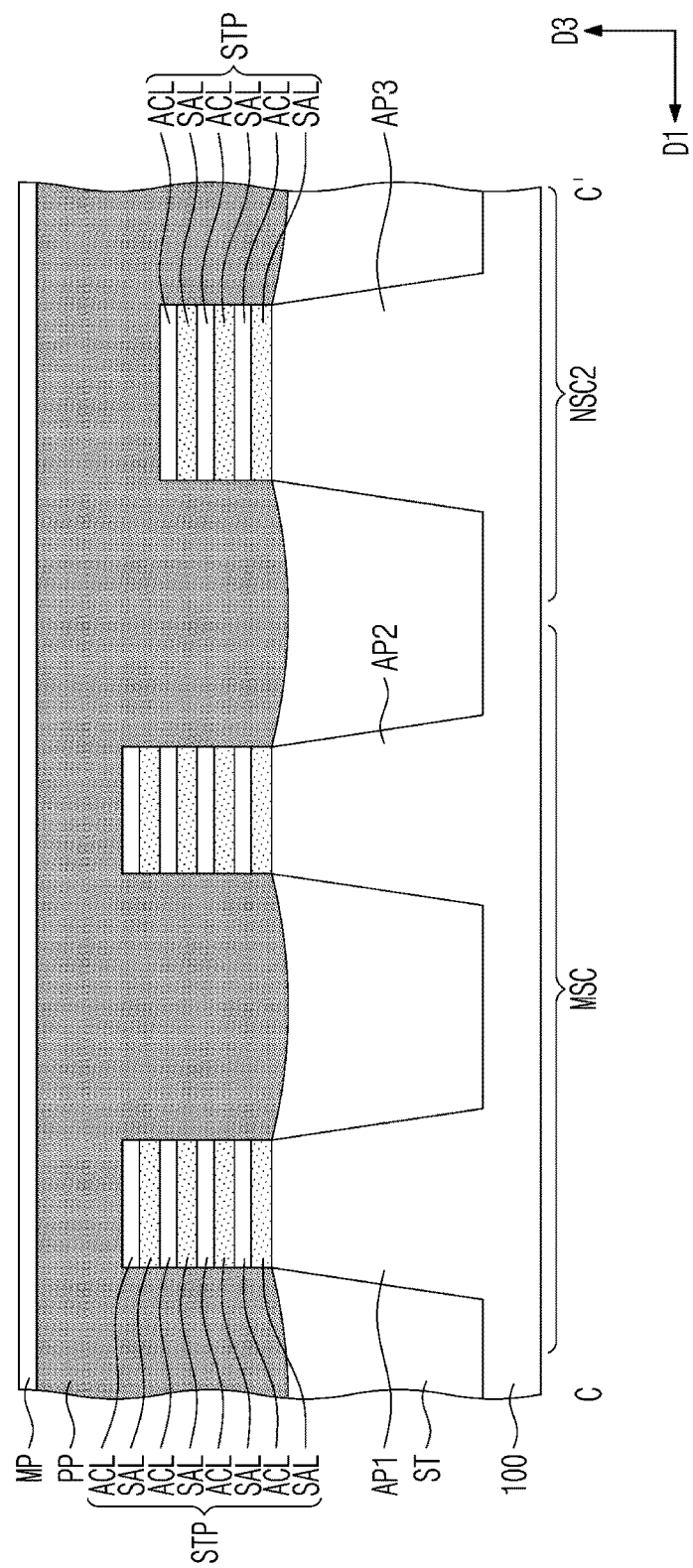

Referring to FIGS. 5, 9A and 9B, the mask layer MSL may be completely removed. Sacrificial patterns PP on (e.g., intersecting/crossing) the stack patterns STP may be formed on the substrate 100. Each of the sacrificial patterns PP may be formed to have a line shape or bar shape extending in the first direction D1. The sacrificial patterns PP may be arranged at a first pitch in the second direction D2.

For example, the formation of the sacrificial patterns PP may include forming a sacrificial layer on an entire top surface of the substrate 100, forming hard mask patterns MP on the sacrificial layer, and patterning the sacrificial layer using the hard mask patterns MP as etch masks. The sacrificial layer may include poly-silicon.

A pair of gate spacers GS may be formed on both (i.e., opposite) sidewalls of each of the sacrificial patterns PP, respectively. The formation of the gate spacers GS may include conformally forming a gate spacer layer on an entire top surface of the substrate 100 and anisotropically etching the gate spacer layer. In some embodiments, the gate spacer GS may be formed of a multi-layer including at least two layers.

According to some embodiments, the sacrificial pattern PP on the buffer cell FIC may extend to intersect a stepped structure in which the height of the stack pattern STP is changed. The sacrificial pattern PP on the buffer cell FIC may cover one end EN1 of the uppermost active layer ACL and one end EN2 of the uppermost sacrificial layer SAL (see FIG. 9A).

Referring to FIGS. 5 and 10A to 10C, first recesses RS1 may be formed in the stack patterns STP on the N-stack cells NSC1 to NSC3. Second recesses RS2 may be formed in the stack pattern STP on the M-stack cell MSC. The device isolation layer ST at both (i.e., opposite) sides of each of the first to fourth active patterns AP1 to AP4 may be recessed when the first and second recesses RS1 and RS2 are formed (see FIG. 10C).

For example, the stack pattern STP on the first active pattern AP1 may be etched using the hard mask patterns MP and the gate spacers GS as etch masks to form the first and second recesses RS1 and RS2. Each of the first and second recesses RS1 and RS2 may be formed between a pair of the sacrificial patterns PP.

In some embodiments, the first and second recesses RS1 and RS2 on the first active pattern AP1 may be formed at the same time. The first recess RS1 on the first active pattern AP1 may be formed to have a first depth DEP1, and the second recess RS2 on the first active pattern AP1 may be formed to have a second depth DEP2. In some embodiments, the first depth DEP1 may be substantially equal to the second depth DEP2. In some embodiments, the first depth DEP1 may be less than the second depth DEP2.

Since the stack pattern STP on the M-stack cell MSC is higher than the stack pattern STP on the first N-stack cell NSC1, the second recess RS2 may be formed to be higher than the first recess RS1. For example, a bottom RS1_B of the first recess RS1 may be lower than a bottom RS2_B of the second recess RS2.

First to third semiconductor patterns SP1, SP2 and SP3 sequentially stacked between the first recesses RS1 adjacent to each other may be formed from the active layers ACL on the first active pattern AP1, respectively. The first to third semiconductor patterns SP1, SP2 and SP3 between the first recesses RS1 adjacent to each other may constitute a first N-stack channel pattern NCH1.

First to fourth semiconductor patterns SP1 to SP4 sequentially stacked between the second recesses RS2 adjacent to each other may be formed from the active layers ACL on the first active pattern AP1, respectively. The first to fourth semiconductor patterns SP1 to SP4 between the second recesses RS2 adjacent to each other may constitute a first M-stack channel pattern MCH1.

Inner spacers ISP may be formed through the first and second recesses RS1 and RS2 on the first active pattern AP1. The formation of the inner spacers ISP may include recessing the sacrificial layers SAL through the first and second recesses RS1 and RS2 to form indent regions, and forming an insulating layer in (e.g., filling) the indent regions.

The stack pattern STP on the second active pattern AP2 may be etched to form the first and second recesses RS1 and RS2. The first and second recesses RS1 and RS2 on the second active pattern AP2 may be formed before or after the formation of the first and second recesses RS1 and RS2 on the first active pattern AP1. In some embodiments, the first and second recesses RS1 and RS2 on the second active pattern AP2 may be formed at the same time. Features of the first and second recesses RS1 and RS2 on the second active pattern AP2 may be similar to the aforementioned features of the first and second recesses RS1 and RS2 on the first active pattern AP1.

The sacrificial layers SAL exposed by the first and second recesses RS1 and RS2 on the second active pattern AP2 may be recessed. Thus, each of the first and second recesses RS1 and RS2 on the second active pattern AP2 may have a wave-shaped inner sidewall. The inner spacers ISP may not be formed on the second active pattern AP2.

First to third semiconductor patterns SP1, SP2 and SP3 sequentially stacked between the first recesses RS1 adjacent to each other may be formed from the active layers ACL on the second active pattern AP2, respectively. The first to third semiconductor patterns SP1, SP2 and SP3 between the first recesses RS1 adjacent to each other may constitute a second N-stack channel pattern NCH2.

First to fourth semiconductor patterns SP1 to SP4 sequentially stacked between the second recesses RS2 adjacent to each other may be formed from the active layers ACL on the second active pattern AP2, respectively. The first to fourth semiconductor patterns SP1 to SP4 between the second recesses RS2 adjacent to each other may constitute a second M-stack channel pattern MCH2.

Referring to FIGS. 5 and 11A to 11C, first N-stack epitaxial patterns NSD1 may be formed in the first recesses RS1 on the first active pattern AP1, respectively. First M-stack epitaxial patterns MSD1 may be formed in the second recesses RS2 on the first active pattern AP1, respectively.

For example, a first selective epitaxial growth (SEG) process may be performed using an inner surface of each of the first and second recesses RS1 and RS2 as a seed layer to form the first N-stack and M-stack epitaxial patterns NSD1 and MSD1. The first N-stack and M-stack epitaxial patterns NSD1 and MSD1 may be grown using the semiconductor patterns SP1 to SP4 and the first active pattern AP1, exposed by the first and second recesses RS1 and RS2, as a seed. For example, the first SEG process may include a chemical vapor deposition (CVD) process or a molecular beam epitaxy (MBE) process.

In some embodiments, the first N-stack and M-stack epitaxial patterns NSD1 and MSD1 on the first active pattern AP1 may include the same semiconductor element (e.g., Si) as the substrate 100. N-type dopants (e.g., phosphorus, arsenic or antimony) may be injected in-situ into the first N-stack and M-stack epitaxial patterns NSD1 and MSD1 during the formation of the first N-stack and M-stack epitaxial patterns NSD1 and MSD1. Alternatively, after the first SEG process is completed, the n-type dopants may be injected or implanted into the first N-stack and M-stack epitaxial patterns NSD1 and MSD1.

Second N-stack epitaxial patterns NSD2 may be formed in the first recesses RS1 on the second active pattern AP2, respectively. Second M-stack epitaxial patterns MSD2 may be formed in the second recesses RS2 on the second active pattern AP2, respectively. For example, a second SEG process may be performed using an inner surface of each of the first and second recesses RS1 and RS2 as a seed layer to form the second N-stack and M-stack epitaxial patterns NSD2 and MSD2. The second N-stack and M-stack epitaxial patterns NSD2 and MSD2 may be grown using the semiconductor patterns SP1 to SP4, the sacrificial layers SAL and the second active pattern AP2, exposed by the first and second recesses RS1 and RS2, as a seed.

In some embodiments, the second N-stack and M-stack epitaxial patterns NSD2 and MSD2 on the second active pattern AP2 may include a semiconductor element (e.g., SiGe) having a lattice constant greater than a lattice constant of the semiconductor element of the substrate 100. P-type dopants (e.g., boron, gallium or indium) may be injected in-situ into the second N-stack and M-stack epitaxial patterns NSD2 and MSD2 during the formation of the second N-stack and M-stack epitaxial patterns NSD2 and MSD2 on the second active pattern AP2. Alternatively, after the second SEG process is completed, the p-type dopants may be injected or implanted into the second N-stack and M-stack epitaxial patterns NSD2 and MSD2.

Referring to FIGS. 5 and 12A to 12C, a first interlayer insulating layer 110 may be formed to cover the N-stack and M-stack epitaxial patterns NSD and MSD, the hard mask patterns MP and the gate spacers GS. For example, the first interlayer insulating layer 110 may include a silicon oxide layer.

The first interlayer insulating layer 110 may be planarized to expose top surfaces of the sacrificial patterns PP. The planarization of the first interlayer insulating layer 110 may be performed using an etch-back process or a chemical mechanical polishing (CMP) process. The hard mask patterns MP may be completely removed during the planarization process. As a result, a top surface of the first interlayer insulating layer 110 may be substantially coplanar with the top surfaces of the sacrificial patterns PP and top surfaces of the gate spacers GS.

The exposed sacrificial patterns PP may be selectively removed. An outer region ORG exposing the N-stack and M-stack channel patterns NCH and MCH may be formed by the removal of the sacrificial patterns PP (see FIG. 12C). The removal of the sacrificial patterns PP may include performing a wet etching process using an etching solution capable of selectively etching poly-silicon.

Figure 12A:
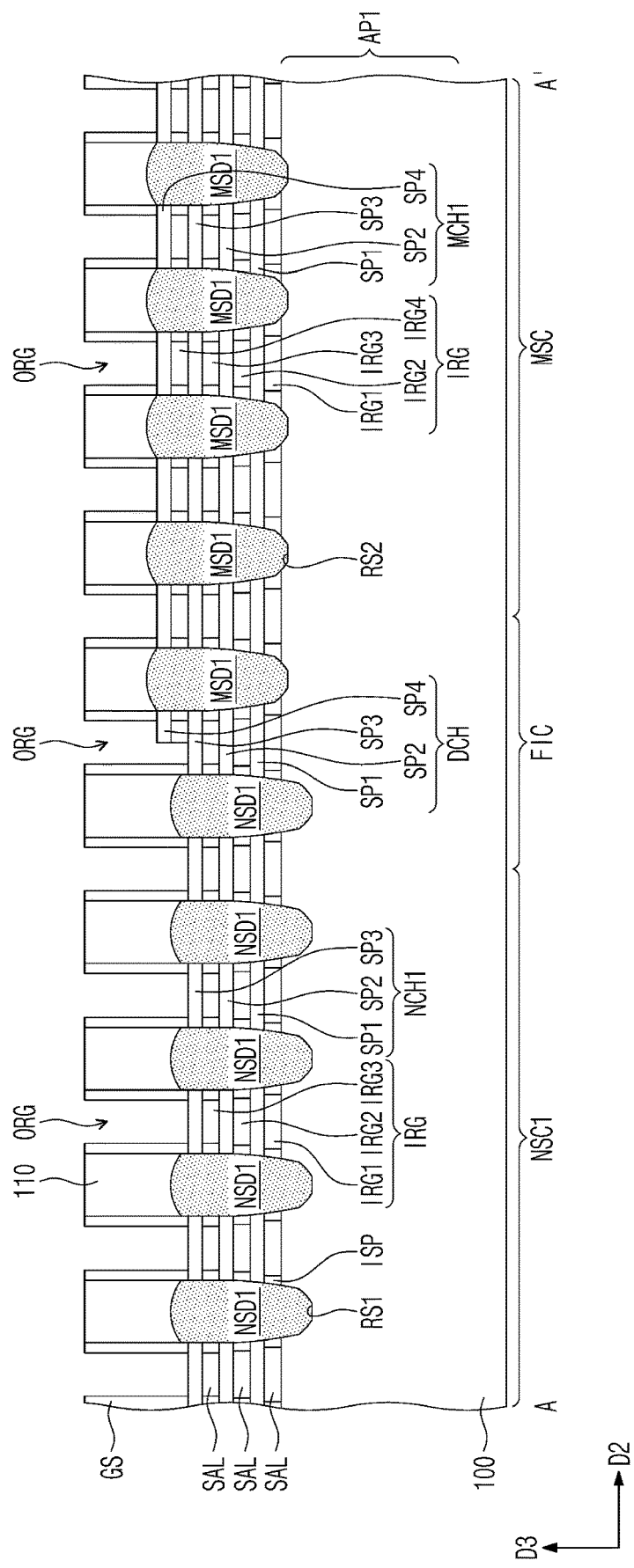
Figure 12B:
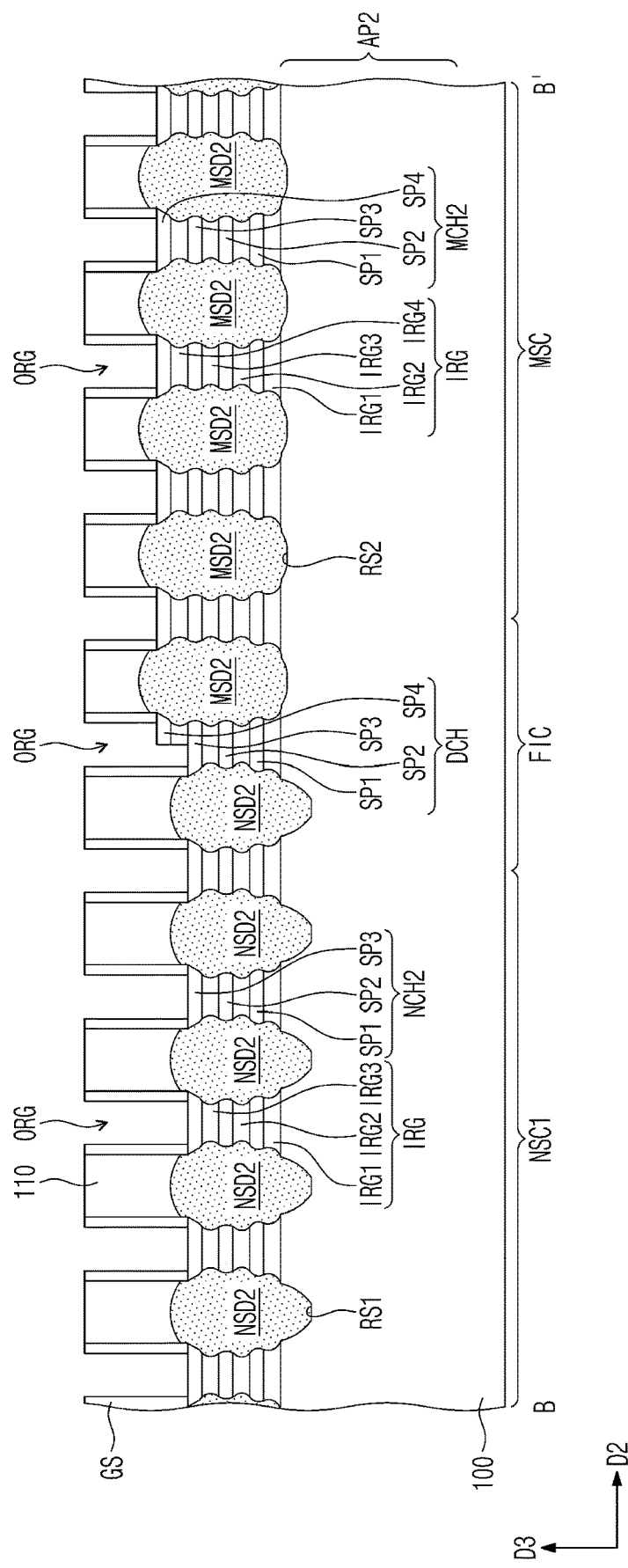
Figure 12C:
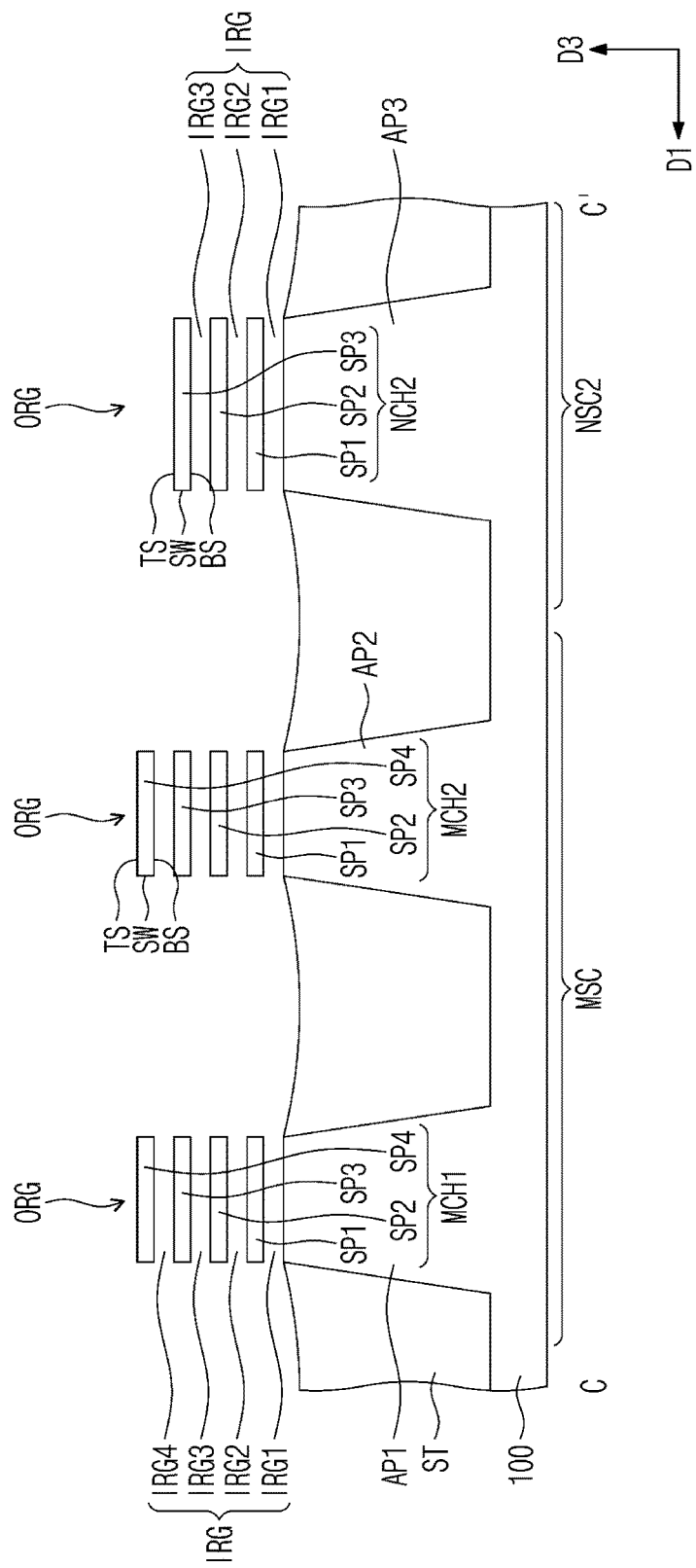
Figure 13A:
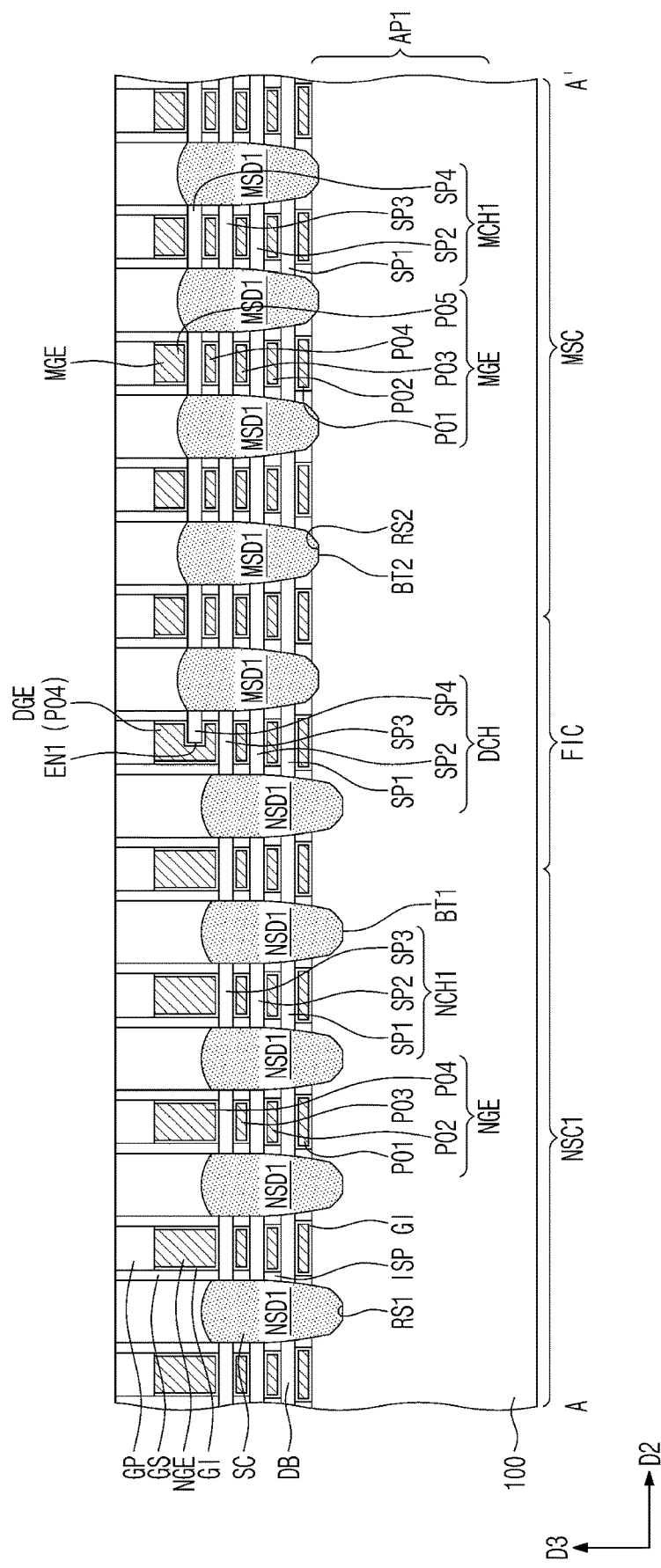
Figure 13B:
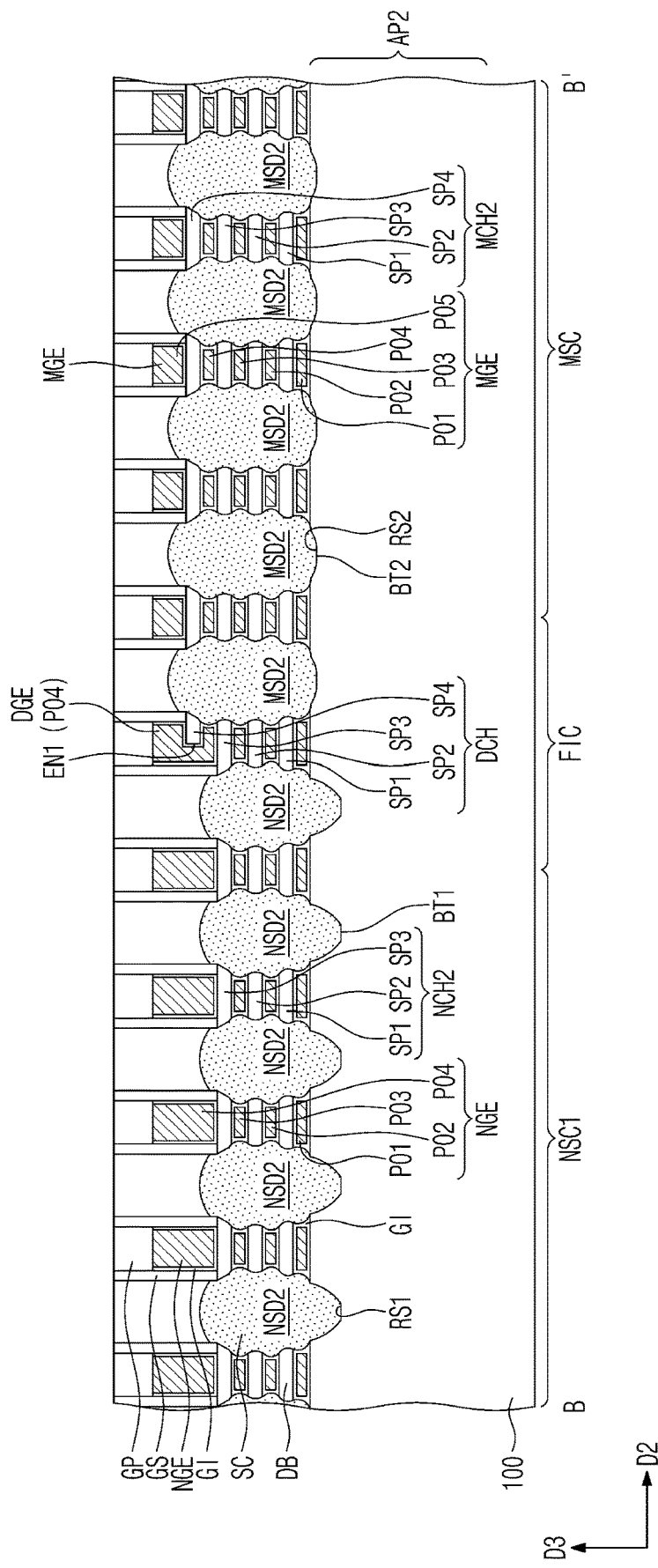
Figure 13C:
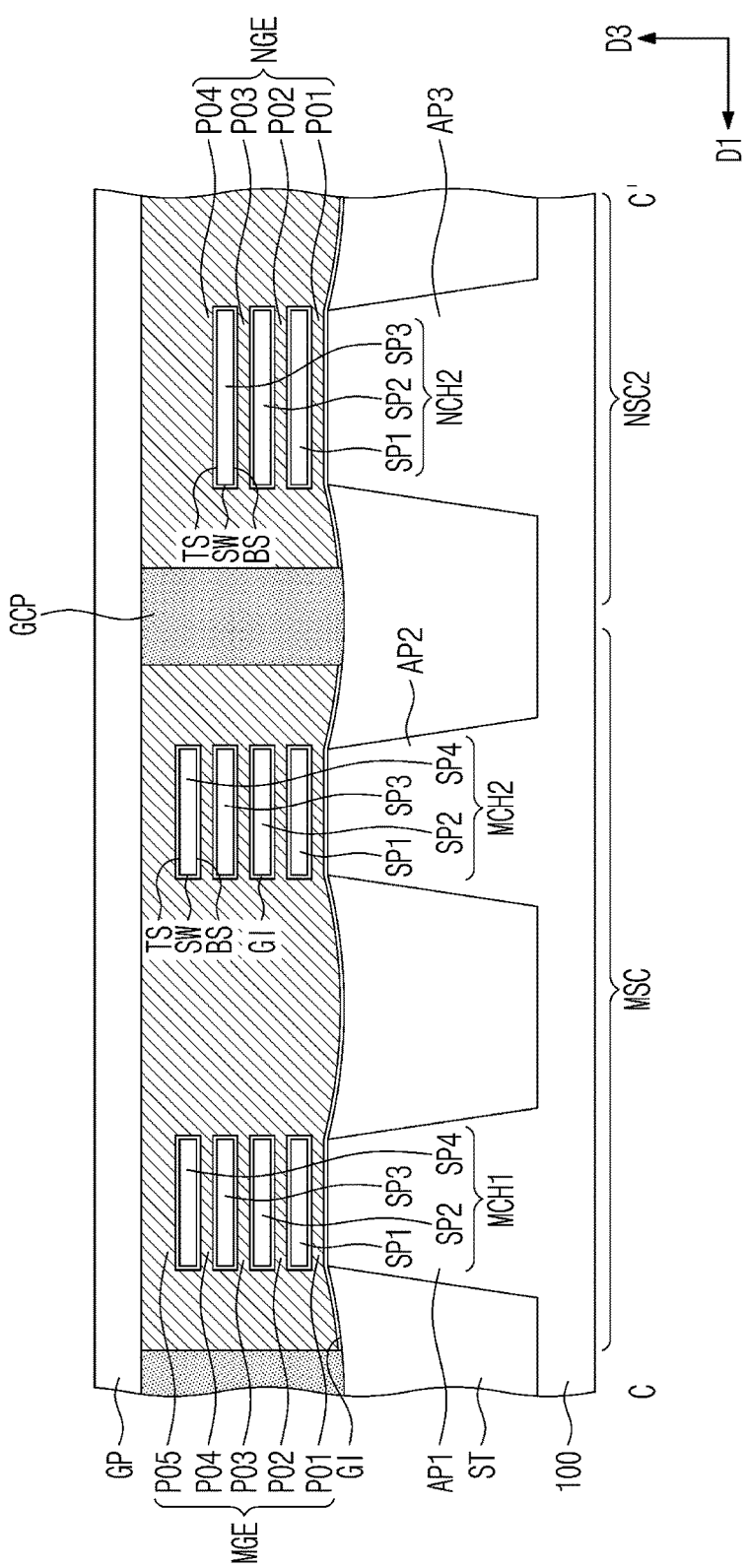

The sacrificial layers SAL exposed through the outer region ORG may be selectively removed to form inner regions IRG (see FIG. 12C). For example, an etching process of selectively etching the sacrificial layers SAL may be performed to remove the sacrificial layers SAL while leaving the first to fourth semiconductor patterns SP1 to SP4. The etching process may have a high etch rate with respect to silicon-germanium having a relatively high germanium concentration. For example, the etching process may have a high etch rate with respect to silicon-germanium having a germanium concentration greater than 10 at %.

The sacrificial layers SAL on the first to fourth active patterns AP1 to AP4 may be completely removed during the etching process. The etching process may be a wet etching process. An etching material used in the etching process may quickly remove the sacrificial layer SAL having a relatively high germanium concentration.

Since the sacrificial layers SAL are selectively removed, stacked N nanosheets (i.e., the first to third semiconductor patterns SP1 to SP3) may remain on the N-stack cells NSC1 to NSC3. First to third inner regions IRG1, IRG2 and IRG3 may be formed by the removal of the sacrificial layers SAL. In detail, the first inner region IRG1 may be formed between each of the active patterns AP1 to AP4 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Since the sacrificial layers SAL are selectively removed, stacked M nanosheets (i.e., the first to fourth semiconductor patterns SP1 to SP4) may remain on the M-stack cell MSC. First to fourth inner regions IRG1 to IRG4 may be formed by the removal of the sacrificial layers SAL. In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, the third inner region IRG3 may be formed between the second semiconductor pattern SP2 and the third semiconductor pattern SP3, and the fourth inner region IRG4 may be formed between the third semiconductor pattern SP3 and the fourth semiconductor pattern SP4.

Referring to FIGS. 5 and 13A to 13C, a gate insulating layer GI may be formed on the exposed first to fourth semiconductor patterns SP1 to SP4. The gate insulating layer GI may be formed to surround each of the first to fourth semiconductor patterns SP1 to SP4. The gate insulating layer GI may be formed in each of the first to fourth inner regions IRG1 to IRG4. The gate insulating layer GI may be formed in the outer region ORG.

N-stack gate electrodes NGE may be formed on the N-stack cells NSC1 to NSC3. The N-stack gate electrode NGE may include first to third portions PO1, PO2 and PO3 formed in the first to third inner regions IRG1, IRG2 and IRG3, respectively, and a fourth portion PO4 formed in the outer region ORG.

M-stack gate electrodes MGE may be formed on the M-stack cell MSC. The M-stack gate electrode MGE may include first to fourth portions PO1 to PO4 formed in the first to fourth inner regions IRG1 to IRG4, respectively, and a fifth portion PO5 formed in the outer region ORG.

A dummy gate electrode DGE may be formed on the buffer cell FIC. The dummy gate electrode DGE may include first to third portions PO1, PO2 and PO3 formed in the first to third inner regions IRG1, IRG2 and IRG3, respectively, and a fourth portion PO4 formed in the outer region ORG. The fourth portion PO4 of the dummy gate electrode DGE may cover one end EN1 of the fourth semiconductor pattern SP4 of the dummy channel pattern DCH Each of the gate electrodes NGE, MGE and DGE may be recessed to reduce its height. Gate capping patterns GP may be formed on the recessed gate electrodes NGE, MGE and DGE.

Referring again to FIGS. 5 and 6A to 6D, a second interlayer insulating layer 120 may be formed on the first interlayer insulating layer 110. The second interlayer insulating layer 120 may include a silicon oxide layer. Active contacts AC may be formed to penetrate the second interlayer insulating layer 120 and the first interlayer insulating layer 110 and may be electrically connected to the N-stack and M-stack epitaxial patterns NSD and MSD, respectively. Gate contacts GC may be formed to penetrate the second interlayer insulating layer 120 and the gate capping pattern GP and may be electrically connected to the N-stack and M-stack gate electrodes NGE and MGE, respectively.

The formation of each of the active contact AC and the gate contact GC may include forming a barrier pattern BM, and forming a conductive pattern FM on the barrier pattern BM. The barrier pattern BM may be conformally formed and may include a metal layer/a metal nitride layer. The conductive pattern FM may include a low-resistance metal.

Isolation structures DB may be formed at boundaries between the logic cells, respectively. The isolation structure DB may penetrate the gate electrode NGE or MGE from the second interlayer insulating layer 120 and may extend into each of the active patterns AP1 to AP4. The isolation structure DB may include an insulating material such as silicon oxide or silicon nitride.

A third interlayer insulating layer 130 may be formed on the active contacts AC and the gate contacts GC. A first metal layer M1 may be formed in the third interlayer insulating layer 130. A fourth interlayer insulating layer 140 may be formed on the third interlayer insulating layer 130. A second metal layer M2 may be formed in the fourth interlayer insulating layer 140.

FIGS. 14 to 18 are cross-sectional views taken along the line A-A' of FIG. 5 to illustrate semiconductor devices according to some embodiments of the inventive concepts. In the following embodiments, the descriptions to the same technical features as mentioned above with reference to FIGS. 1 to 6D will be omitted and differences between the following embodiments and the above embodiments of FIGS. 1 to 6D will be mainly described in detail, for the purpose of ease and convenience in explanation.

Figure 14:
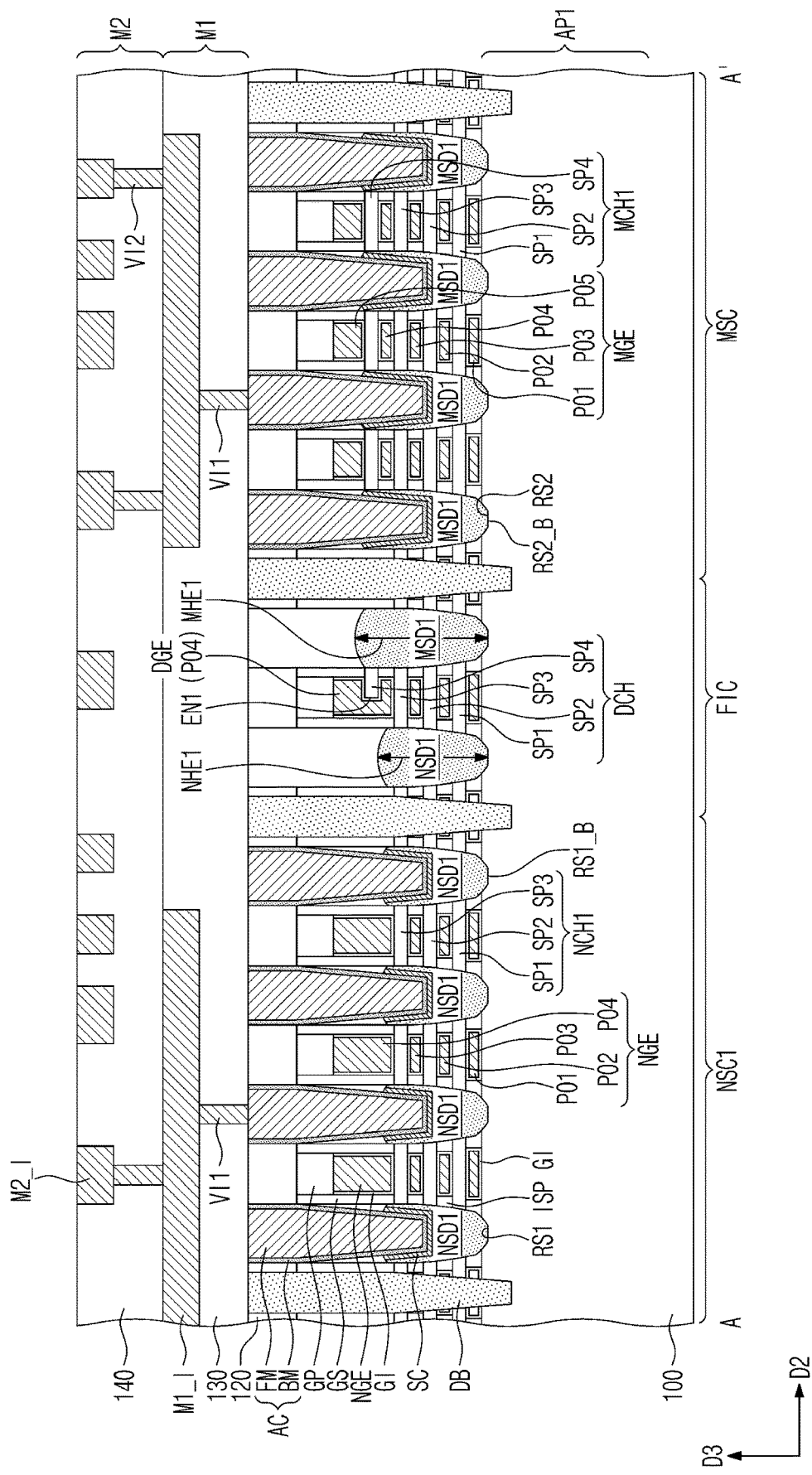
FIGS. 14 to 18 are cross-sectional views taken along the line A-A' of FIG. 5 to illustrate semiconductor devices according to some embodiments of the inventive concepts.

Referring to FIGS. 5 and 14, a bottom RS1_B of a first recess RS1 on the first active pattern AP1 may be located at substantially the same level as a bottom RS2_B of a second recess RS2 on the first active pattern AP1. A level of a topmost surface of the first N-stack epitaxial pattern NSD1 in the first recess RS1 may be lower than a level of a topmost surface of the first M-stack epitaxial pattern MSD1 in the second recess RS2. Thus, a height NHE1 of the first N-stack epitaxial pattern NSD1 may be less than a height MHE1 of the first M-stack epitaxial pattern MSD1 of the M-stack cell MSC.

The first recess RS1 and the second recess RS2 according to some embodiments may be formed by different processes, unlike the embodiments described above with reference to FIGS. 10A to 10C. Thus, the first recess RS1 and the second recess RS2 may be adjusted to have different depths.

Figure 15:
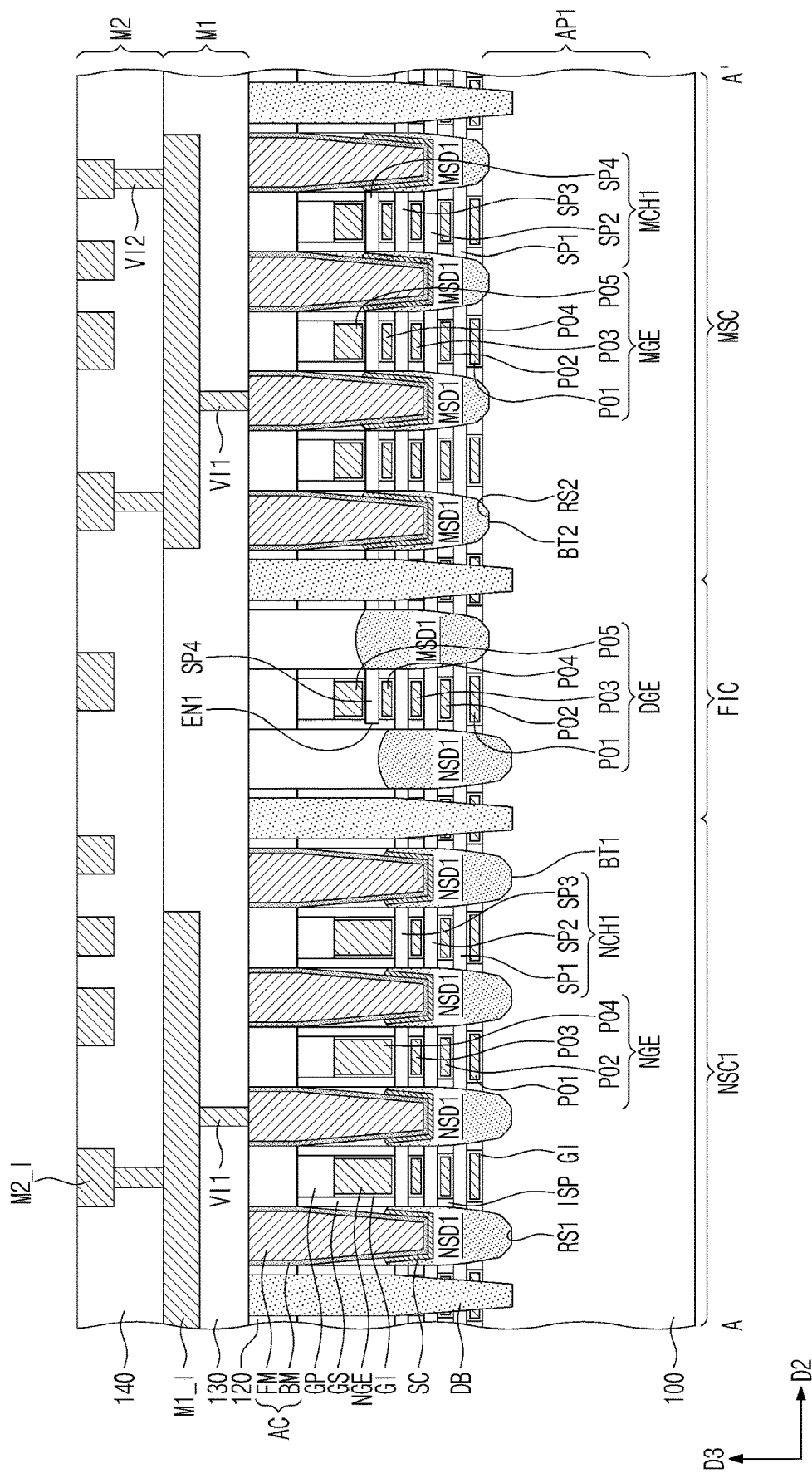

Referring to FIGS. 5 and 15, one end EN1 of an uppermost nanosheet (i.e., a fourth semiconductor pattern SP4) of the buffer cell FIC may be buried in (e.g., may extend into) the gate spacer GS. Thus, the dummy gate electrode DGE may include first to fifth portions PO1 to PO5, like the M-stack gate electrode MGE. The first N-stack epitaxial pattern NSD1 and the first M-stack epitaxial pattern MSD1 which are located at different levels may be provided at both (i.e., opposite) sides of the dummy gate electrode DGE, respectively.

Figure 16:
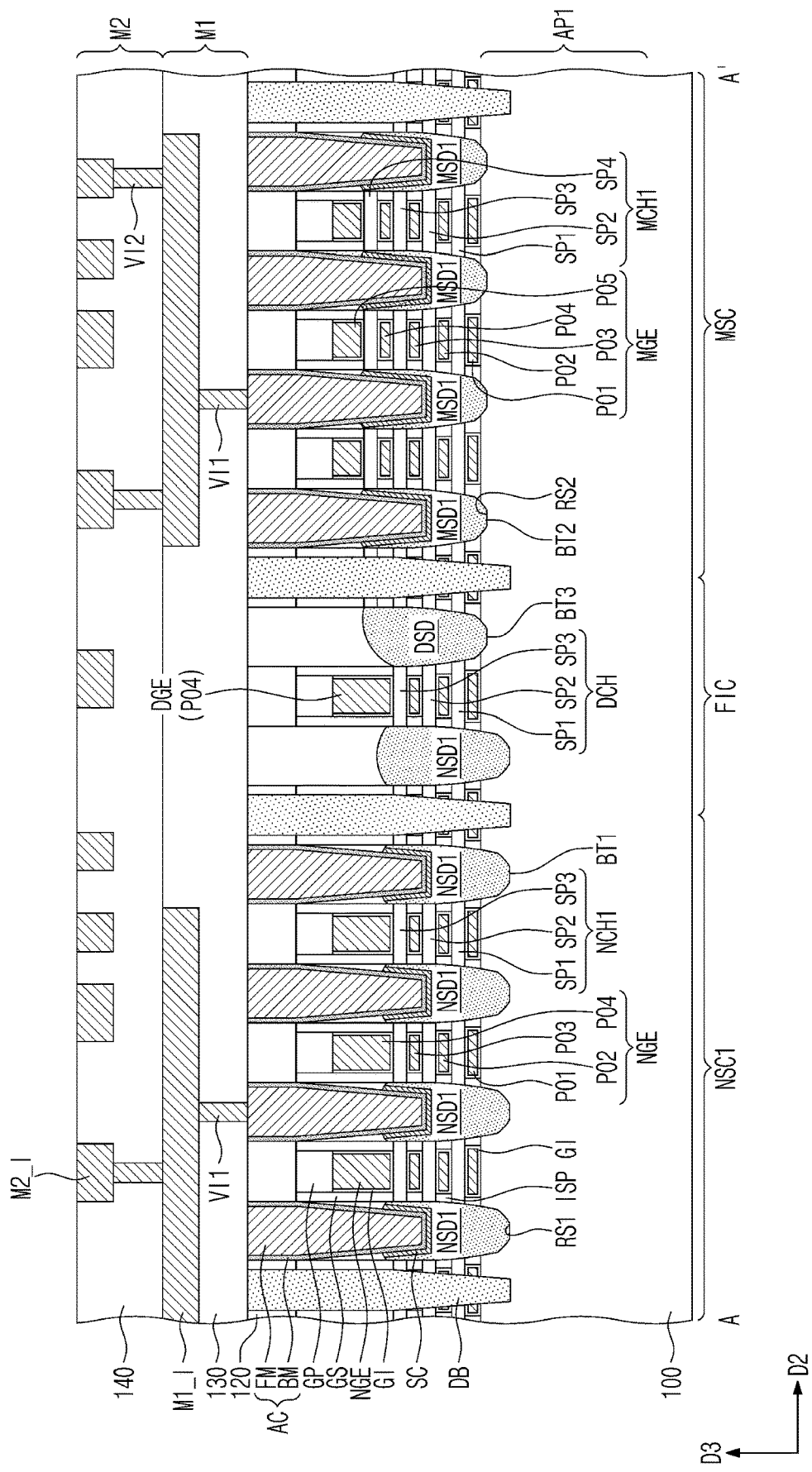

Referring to FIGS. 5 and 16, a dummy channel pattern DCH of the buffer cell FIC may include N nanosheets (i.e., first to third semiconductor patterns SP1 to SP3). Thus, the dummy gate electrode DGE may include first to fourth portions PO1 to PO4, like the N-stack gate electrode NGE.

A dummy epitaxial pattern DSD connected to M nanosheets may be provided at a side of the dummy channel pattern DCH. The dummy epitaxial pattern DSD may electrically connect three nanosheets of the dummy channel pattern DCH to four nanosheets of the first M-stack channel pattern MCH1. Thus, a top surface of the dummy epitaxial pattern DSD may have a profile which becomes progressively higher from the dummy channel pattern DCH toward the first M-stack channel pattern MCH1.

A bottom surface BT3 of the dummy epitaxial pattern DSD may be located at a higher level than the bottom surface BT1 of the first N-stack epitaxial pattern NSD1. The bottom surface BT3 of the dummy epitaxial pattern DSD may be located at a lower level than the bottom surface BT2 of the first M-stack epitaxial pattern MSD1.

Figure 17:
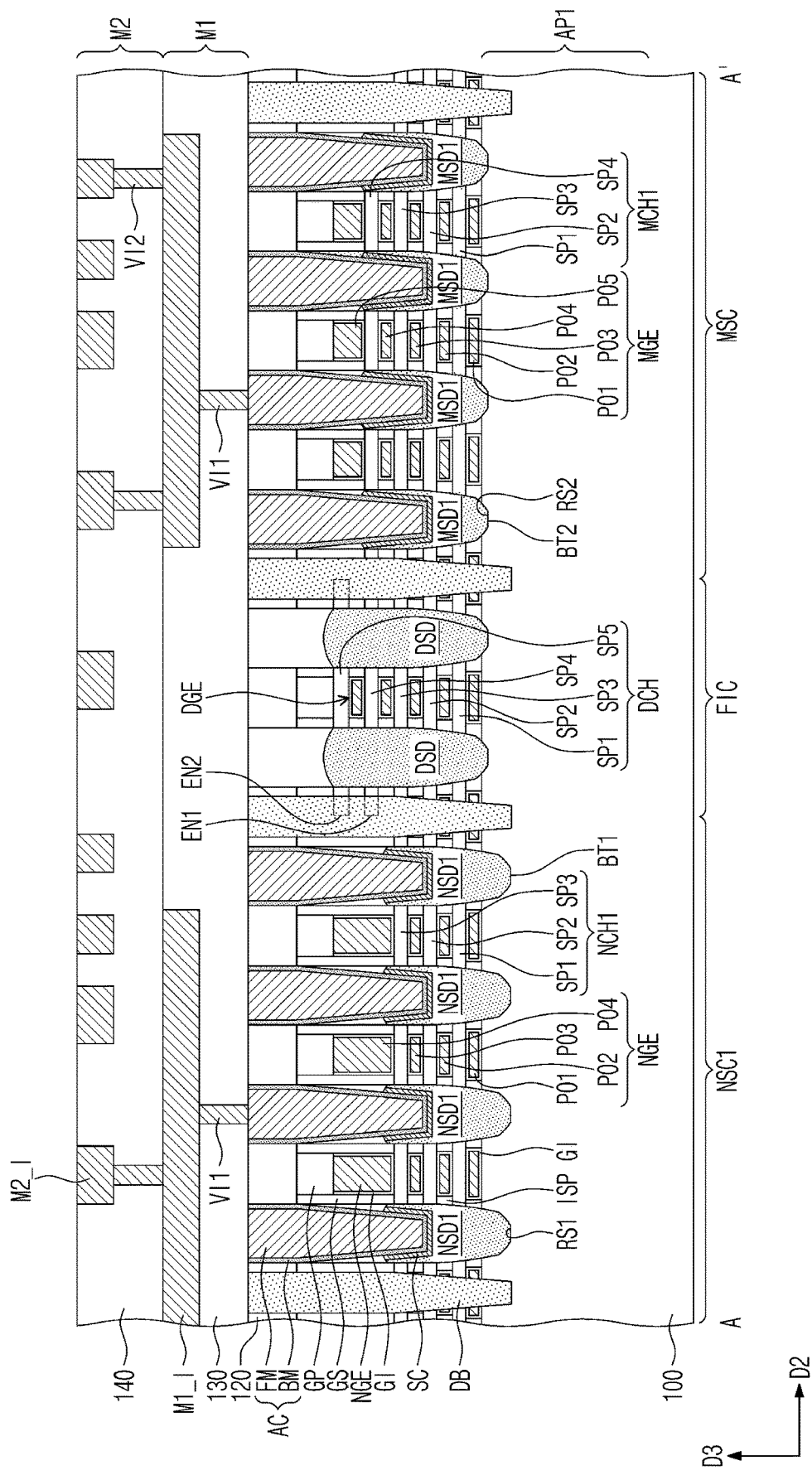

Referring to FIGS. 5 and 17, a dummy channel pattern DCH of the buffer cell FIC may include L nanosheets. The number 'L' may be an integer number greater than the number 'M' and may be, for example, five. In other words, the dummy channel pattern DCH may include first to fifth semiconductor patterns SP1 to SP5. At least one isolation structure DB may be penetrated by one end EN1 of the fourth semiconductor pattern SP4 and one end EN2 of the fifth semiconductor pattern SP5.

Dummy epitaxial patterns DSD may be provided at both (i.e., opposite) sides of the dummy gate electrode DGE, respectively. A height of the dummy epitaxial pattern DSD may be greater than a height of the first M-stack epitaxial pattern MSD1.

Figure 18:
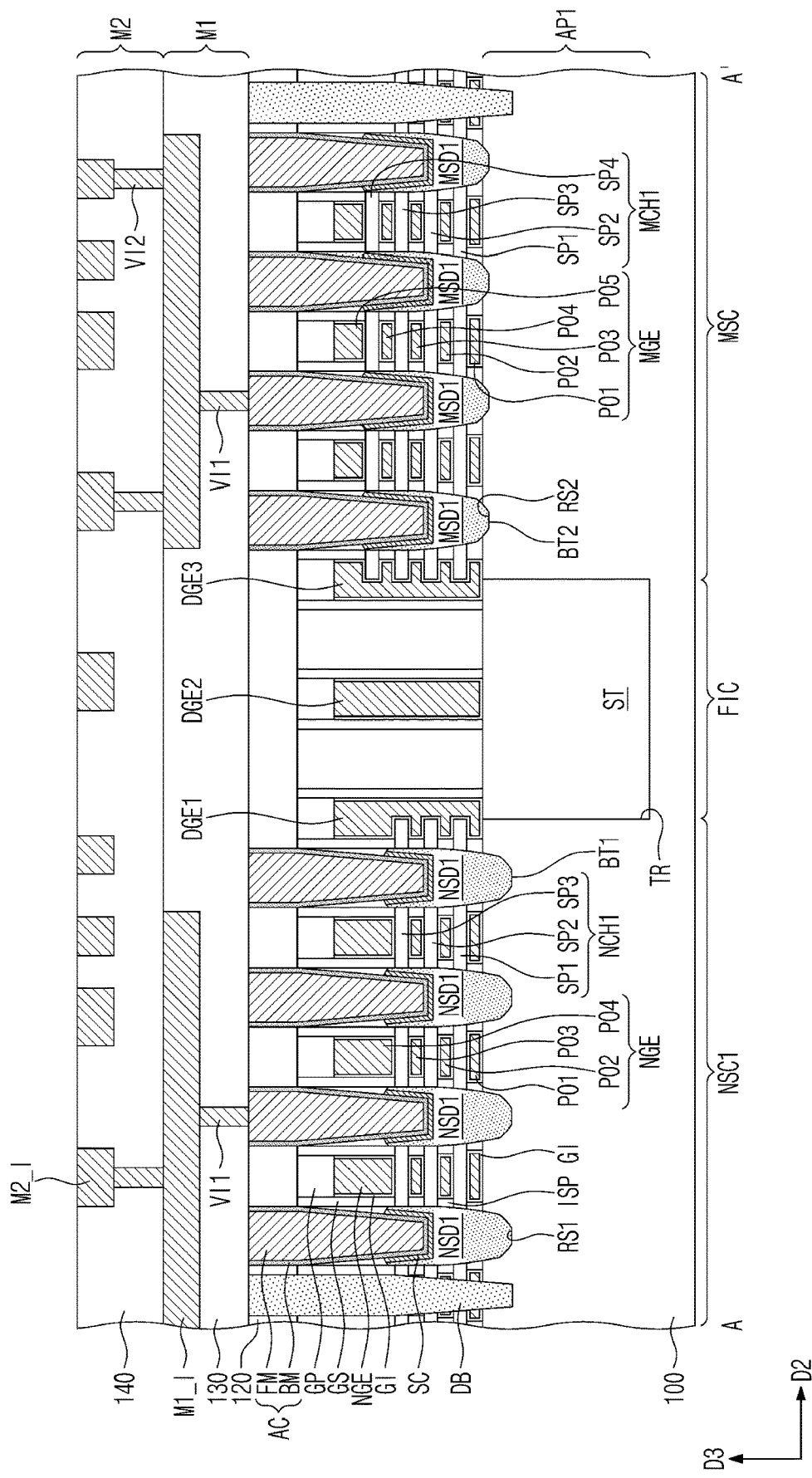

Referring to FIGS. 5 and 18, a trench TR penetrating an upper portion of the first active pattern AP1 may be provided in the buffer cell FIC. The first N-stack cell NSC1 and the M-stack cell MSC may be completely isolated from each other by the device isolation layer ST in (e.g., filling) the trench TR of the buffer cell FIC.

First to third dummy gate electrodes DGE1 to DGE3 may be provided in the buffer cell FIC. The first to third dummy gate electrodes DGE1 to DGE3 may be arranged in the second direction D2. The first dummy gate electrode DGE1 may cover ends of the first to third semiconductor patterns SP1 to SP3 of the first N-stack channel pattern NCH1. The third dummy gate electrode DGE3 may cover ends of the first to fourth semiconductor patterns SP1 to SP4 of the first M-stack channel pattern MCH1. The second dummy gate electrode DGE2 may extend in the first direction D1 on a central portion of the device isolation layer ST.

In the semiconductor device according to the inventive concepts, a low-power logic cell may be realized using the N-stack cell in which N nanosheets are stacked. In addition, a high-performance logic cell may be realized using the M-stack cell in which M nanosheets more than the N nanosheets are stacked. Furthermore, in the semiconductor device of the inventive concepts, the N-stack cell and the M-stack cell may be disposed adjacent to each other in a single cell block by using the buffer cell. A structural difference between the N-stack cell and the M-stack cell may be changed through (e.g., may transition in) the buffer cell, and thus reliability of a semiconductor process may be improved.

While embodiments of the inventive concepts have been particularly shown and described, it will be understood by one of ordinary skill in the art that variations in form and detail may be made therein without departing from the scope of the attached claims.

What is claimed is:

1. A semiconductor device comprising:
   a substrate including an N-stack cell region, a buffer cell region, and an M-stack cell region, wherein the buffer cell region is between the N-stack cell region and the M-stack cell region;
   an active pattern extending from an N-stack cell that is on the N-stack cell region to an M-stack cell that is on the M-stack cell region via a buffer cell that is on the buffer cell region;
   an N-stack channel pattern on a first portion of the active pattern in the N-stack cell;
   an M-stack channel pattern on a second portion of the active pattern in the M-stack cell;

a dummy channel pattern on a third portion of the active pattern in the buffer cell;

an N-stack epitaxial pattern between the N-stack channel pattern and the dummy channel pattern; and an M-stack epitaxial pattern between the M-stack channel pattern and the dummy channel pattern, wherein the N-stack channel pattern comprises N semiconductor patterns that are stacked, wherein the M-stack channel pattern comprises M semiconductor patterns that are stacked, wherein each of N and M is an integer number of 2 or more, and M is greater than N, and wherein a bottom surface of the N-stack epitaxial pattern is lower than a bottom surface of the M-stack epitaxial pattern.

2. The semiconductor device of claim 1, further comprising:

an N-stack gate electrode on the N-stack channel pattern;

an M-stack gate electrode on the M-stack channel pattern; and a dummy gate electrode on the dummy channel pattern.

3. The semiconductor device of claim 2, wherein the buffer cell is narrower than each of the N-stack cell and the M-stack cell, and wherein the N-stack gate electrode includes N portions in N inner regions, respectively, between the N semiconductor patterns, and wherein the M-stack gate electrode includes M portions in M inner regions, respectively, between the M semiconductor patterns.

4. The semiconductor device of claim 2, wherein the dummy channel pattern comprises M semiconductor patterns that are stacked, and wherein one end of an uppermost semiconductor pattern of the M semiconductor patterns of the dummy channel pattern extends into the dummy gate electrode.

5. The semiconductor device of claim 2, further comprising:

a gate spacer covering a sidewall of the dummy gate electrode, wherein the dummy channel pattern comprises M semiconductor patterns that are stacked, and wherein one end of an uppermost semiconductor pattern of the M semiconductor patterns of the dummy channel pattern extends into the gate spacer.

6. The semiconductor device of claim 2, further comprising:

an isolation structure between the N-stack gate electrode and the dummy gate electrode, wherein a pitch between the N-stack gate electrode and the isolation structure is substantially equal to a pitch between the dummy gate electrode and the isolation structure.

7. The semiconductor device of claim 2, further comprising:

an isolation structure between the M-stack gate electrode and the dummy gate electrode, wherein a pitch between the M-stack gate electrode and the isolation structure is substantially equal to a pitch between the dummy gate electrode and the isolation structure.

8. The semiconductor device of claim 1, wherein a top surface of the N-stack epitaxial pattern is lower than a top surface of the M-stack epitaxial pattern.

9. The semiconductor device of claim 1, wherein the dummy channel pattern comprises L semiconductor patterns that are stacked, and wherein L is an integer number greater than M.

10. The semiconductor device of claim 1, further comprising:

a first power interconnection line and a second power interconnection line on the substrate, wherein the first and second power interconnection lines extend in one direction in parallel to each other, wherein a cell block is defined between the first and second power interconnection lines, and wherein the N-stack cell, the buffer cell, and the M-stack cell are arranged in the one direction in the cell block.

11. A semiconductor device comprising:

a first power interconnection line and a second power interconnection line on a substrate; and an N-stack cell, a buffer cell, and an M-stack cell that are in a cell block between the first and second power interconnection lines, wherein the N-stack cell comprises a first gate-all-around field-effect transistor (GAAFET) comprising N nanosheets, wherein the M-stack cell comprises a second GAAFET comprising M nanosheets, wherein each of N and M is an integer number of 2 or more, and M is greater than N, wherein the buffer cell is between the N-stack cell and the M-stack cell, and wherein the N nanosheets transition to the M nanosheets in the buffer cell.

12. The semiconductor device of claim 11, wherein the buffer cell comprises a dummy channel pattern comprising M nanosheets, and wherein an uppermost nanosheet of the M nanosheets of the dummy channel pattern is shorter than lower nanosheets of the M nanosheets of the dummy channel pattern.

13. The semiconductor device of claim 11, wherein the buffer cell includes a device isolation layer in a trench between the N-stack cell and the M-stack cell.

14. The semiconductor device of claim 11, further comprising:

a first isolation structure between the N-stack cell and the buffer cell; and a second isolation structure between the M-stack cell and the buffer cell.

15. The semiconductor device of claim 14, wherein each of the first and second isolation structures is a single diffusion break.

16. A semiconductor device comprising:

a substrate comprising a first active pattern and a second active pattern that are spaced apart from each other in a first direction;

a device isolation layer in a trench between the first and second active patterns;

an N-stack channel pattern on the first active pattern, the N-stack channel pattern comprising N semiconductor patterns that are spaced apart from each other and are vertically stacked;

an M-stack channel pattern on the second active pattern, the M-stack channel pattern comprising M semiconductor patterns that are spaced apart from each other and are vertically stacked;

an N-stack gate electrode on the N-stack channel pattern, the N-stack gate electrode surrounding a top surface, a bottom surface, and opposite sidewalls of each of the N semiconductor patterns;

an M-stack gate electrode on the M-stack channel pattern, the M-stack gate electrode surrounding a top surface, a bottom surface, and opposite sidewalls of each of the M semiconductor patterns; and a gate cutting pattern between the N-stack gate electrode and the M-stack gate electrode, wherein each of N and M is an integer number of 2 or more, and M is greater than N, wherein the gate cutting pattern is between, in the first direction, the N-stack gate electrode and the M-stack gate electrode, and wherein a width of the N-stack channel pattern in the first direction is different from a width of the M-stack channel pattern in the first direction.

17. The semiconductor device of claim 16, wherein the gate cutting pattern comprises an insulating material that electrically isolates the N-stack gate electrode from the M-stack gate electrode.

18. The semiconductor device of claim 16, wherein the N-stack gate electrode includes N portions in N inner regions, respectively, between the N semiconductor patterns, and wherein the M-stack gate electrode includes M portions in M inner regions, respectively, between the M semiconductor patterns.

19. The semiconductor device of claim 16, wherein the first and second active patterns comprise respective PMOSFET regions or respective NMOSFET regions.

20. The semiconductor device of claim 16, further comprising:

a first gate contact electrically connected to the N-stack gate electrode;

a second gate contact electrically connected to the M-stack gate electrode; and a first metal layer on the first and second gate contacts, wherein the first metal layer comprises:

a power interconnection line vertically overlapping the gate cutting pattern; and interconnection lines electrically connected to the first and second gate contacts, respectively.

* * * * *